United States Patent
Bromberg et al.

(10) Patent No.: US 11,937,519 B1
(45) Date of Patent: Mar. 19, 2024

(54) PERMANENT MAGNETS USING HIGH TEMPERATURE SUPERCONDUCTOR TAPES AND METHODS OF CHARGING SAME

(71) Applicant: TECO Westinghouse Motor Company, Round Rock, TX (US)

(72) Inventors: Leslie Bromberg, Sharon, MA (US); Dean Sarandria, Jonestown, TX (US); Edward Kuan-Chen Chen, Austin, TX (US); Gabriel Rupertus, Austin, TX (US)

(73) Assignee: TECO-WESTINGHOUSE MOTOR COMPANY, Round Rock, TX (US)

( * ) Notice: Subject to any disclaimer, the term of this patent is extended or adjusted under 35 U.S.C. 154(b) by 3267 days.

(21) Appl. No.: 13/815,975

(22) Filed: Mar. 15, 2013

(51) Int. Cl.
 *H10N 60/83* (2023.01)
(52) U.S. Cl.
 CPC .................................. *H10N 60/83* (2023.02)
(58) Field of Classification Search
 CPC ....................................................... H10N 60/83
 See application file for complete search history.

(56) References Cited

U.S. PATENT DOCUMENTS 7,566,684 B1    7/2009 Levin et al.

OTHER PUBLICATIONS

Levin, "Persistent current in coils made out of second generation high temperature superconductor wire", Applied Physics Letters, vol. 93, Aug. 2008, pp. 062504-1 to 062504-3.*
Levin, G. A. et al.: "Persistent current in coils made out of second generation high temperature superconductor wire", Applied Physics Letters, vol. 93, (2008), 3 pages.

* cited by examiner

*Primary Examiner* — C Melissa Koslow
(74) *Attorney, Agent, or Firm* — Norton Rose Fulbright US LLP

(57) ABSTRACT

Permanent magnets using high temperature superconductor tapes are disclosed. For example, a magnet may include a superconductor tape having two ends, a slit in the superconductor tape between the two ends that forms two legs, a separation between the legs that forms a loop, and a trapped magnetic field in the superconductor tape.

6 Claims, 26 Drawing Sheets

PERMANENT MAGNETS USING HIGH TEMPERATURE SUPERCONDUCTOR TAPES AND METHODS OF CHARGING SAME

GOVERNMENT LICENSE RIGHTS

The invention was made with government support under Agreement No. N00014-11-C-0451 awarded by The Office of Naval Research. The government has certain rights in the invention.

BACKGROUND OF THE INVENTION

Field of the Invention

This invention relates generally to superconductor magnets and more particularly relates to permanent magnets using high temperature superconductor tapes.

Description of the Related Art

Until recently the use of superconductors was limited to operation at very low temperatures-around 4-10 Kelvin (K). However, advances have taken place with the use of high temperature superconductors ("HTS") and, in particular, second generation superconductors, also known as "coated conductors." These materials have desirable properties at temperatures up to about 77K, which is approximately the boiling temperature of liquid nitrogen, with critical temperatures as high as about 90K. However, at the present these materials have manufacturing limitations. For example, the length of a particular sample of HTS is limited due to fabrication constraints. HTS are also limited by the effectiveness of splices. Presently, there is no way of making persistent (superconducting) splices or joints with second generation conductors. A large number of applications require joints that are either superconducting (such as no dissipation, with 0 resistance for current flowing across the joint) or very low resistance (with limited rate of decay of magnetic field/current with time). For some applications that require magnets without splices, the limitation is significant and results in magnets that are either driven (with current introduced through current leads) or decay due to finite resistance. Some HTS applications include NMR, MRI, general purpose magnets (including undulators) and motor/generators, with magnets that have fields with very low decay rates.

An alternative method of using HTS is the use of bulk superconducting material. Such bulk material is a monolith, without current leads or a fixed direction of current flow, and is characterized by the absence of winding. The material is a solid and is usually anisotropic. Because it lacks current leads and windings, it needs to be charged through unconventional methods. Several methods have been described in the literature, but most methods can basically be classified as either field freezing or flux pumping. In the case of field freezing, magnetic fields are applied externally when the sample is in a non-superconducting state. The sample is then made superconducting and the external field is removed. In the case of flux pumping, the sample is cold and is temporarily driven to a critical state during which the magnetic flux can penetrate through the material. The material is then driven back to the superconducting regime. Usually, the material is driven to the critical state by applying fields and/or currents in the superconductor that, when combined, result in a state where the flux can move freely (although with dissipation) through the conductor. Several methods have been suggested for charging superconductors using this technique. Once charged, the currents and the associated magnetic field generated by these currents remain for long periods of time, as long as the temperature of the superconductors remain low. Because they work by the capture of fields generated externally, these monoliths are referred to as trapped field magnets (TFMs), and they behave somewhat as "permanent" magnets.

In principle, it would be best to use a large monolith, with material only where the current is desired to flow and continuous in that that direction. But his requires large monoliths, and technology for making them is not currently available. Most commercially available monoliths of YBCO material are limited in size to about 25 mm in diameter. Although larger sizes are possible (e.g. 10 cm diameter YBCO monolith made in Japan), they are not commercially available. Although larger monoliths are available from other HTS materials, such as BSCCO 2212, their performance is substantially reduced compared with YBCO monoliths. One alternative is to use a large number of small monoliths placed in an array or stack. FIG. 1A shows such an array with a large number of small monoliths 102 where each small monolith has an internal current 104. As seen in FIG. 1A, most of the currents 104 in the monoliths cancel each other. As seen in FIG. 1B, the array of small monoliths has an equivalent current 106 that flows on the perimeter of the array. The large number of monoliths in the array results in a large amount of superconductor material used, which is expensive, and does not actually directly result in increased field.

Herein, information labeled "prior art" is admitted prior art. Information that is not identified or otherwise labeled as "prior art" is not admitted prior art.

SUMMARY

Tapes and tape arrangements that can be superconducting are disclosed. Some embodiments provide a magnet that includes a superconductor tape having two ends; a slit in the superconductor tape between the two ends that forms two legs; a separation between the legs that forms a loop; and a trapped magnetic field in the superconductor tape.

Some embodiments provide tape arrangements. Some have not yet been charged, and they may take the form of multiple, partially-slit taps arranged in an array. Some tape arrangements comprise multiple, partially-slit tapes in separate arrays that are stacked on each other. The arrangements may comprise a loop.

Some of the tape arrangements comprise a superconductor tape having two ends that is wound in a coil, the superconducting tape having a superconducting side and an opposing non-superconducting side and a length, the superconducting tape being arranged such that the superconducting side of the tape is adjacent to and coupled to itself for greater than half of the length.

Some embodiments provide a magnet that includes a superconductor tape having two ends that is wound in a coil; a conductor connecting the two ends; and a trapped magnetic field in the superconductor tape.

Some embodiments provide a magnet that includes a loop made of a superconducting tape without a splice or splices and without a slit. The loop may be formed through an extrusion process. The loop may have two joined ends. The loop may be formed by deposition of a superconductor material that, in part, makes the superconductor tape.

Some embodiments provide a method for trapping a magnetic field in a superconductor tape. Some of the methods include establishing an external magnetic field near a superconductor tape when the superconductor tape is at a temperature above a critical temperature, where the superconductor tape has two ends, a slit in the superconductor tape between the two ends that forms two legs, and a separation between the legs that forms a loop; cooling the superconductor tape to a temperature that is below the critical temperature; and removing the external magnetic field.

Some embodiments provide a method for trapping a magnetic field in a superconductor tape. Some of the methods include cooling a superconductor tape to a temperature below a critical temperature, where the superconductor tape has two ends, a slit in the superconductor tape between the two ends that forms two legs, and a separation between the legs that forms a loop; generating an external magnetic field near the superconductor tape that is larger than a critical field of the superconductor tape; and reducing the external magnetic field.

Some embodiments provide a method for trapping a magnetic field in a superconductor tape. Some of the methods include applying a first external magnetic field to a superconductor tape with a first magnetic field source, where the superconductor tape has two ends, a slit in the superconductor tape between the two ends that forms two legs, and a separation between the legs that forms a loop; applying a second external magnetic field that exceeds a critical field to at least a portion of the superconductor tape with a second magnetic field source; and reducing the first and second external magnetic fields.

The term "coupled" is defined as connected, although not necessarily directly, and not necessarily mechanically.

The terms "a" and "an" are defined as one or more unless this disclosure explicitly requires otherwise.

The term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within [a percentage] of" what is specified, where the percentage includes 0.1, 1, 5, and 10 percent.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a magnet, or a component of a magnet, that "comprises," "has," "includes," or "contains" one or more elements or features possesses those one or more elements or features, but is not limited to possessing only those elements or features. Likewise, a method that "comprises," "has," "includes," or "contains" one or more steps possesses those one or more steps, but is not limited to possessing only those one or more steps. Additionally, terms such as "first" and "second" are used only to differentiate structures or features, and not to limit the different structures or features to a particular order. Furthermore, a device or structure that is configured in a certain way is configured in at least that way, but may also be configured in ways that are not listed.

Any embodiment of any of the present tape arrangements, magnets, and methods can consist of or consist essentially of—rather than comprise/include/contain/have—any of the described elements and/or features. Thus, in any of the claims, the term "consisting of" or "consisting essentially of" can be substituted for any of the open-ended linking verbs recited above, in order to change the scope of a given claim from what it would otherwise be using the open-ended linking verb.

The feature or features of one embodiment may be applied to other embodiments, even though not described or illustrated, unless expressly prohibited by this disclosure or the nature of the embodiments.

Details associated with the embodiments described above and others are presented below.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers.

FIG. 15A shows a solenoid, FIG. 15B shows a dipole at an end, and FIG. 15C shows a dipole in one of the legs of the loop.

DETAILED DESCRIPTION

Various features and advantageous details are explained more fully with reference to the non-limiting embodiments that are illustrated in the accompanying drawings and detailed in the following description. Descriptions of well-known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Some embodiments of the present superconductor tape arrangements may be charged by, for example, field freezing or flux pumping and used instead of permanent magnets in certain applications.

Figure 1A:
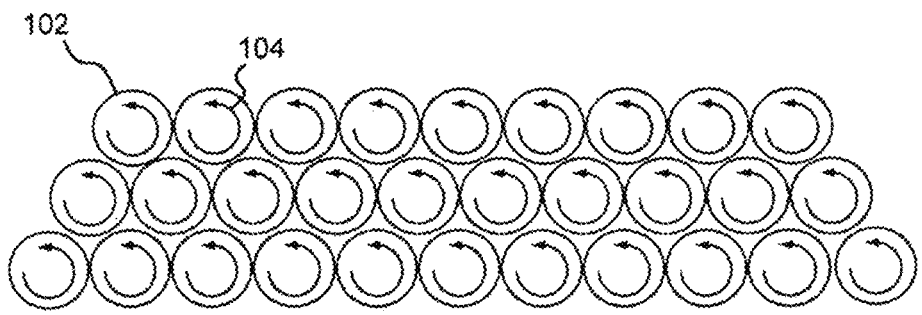
FIGS. 1A and 1B show a prior art array of monoliths (TFMs) and the direction of current in each one.
Figure 1B:
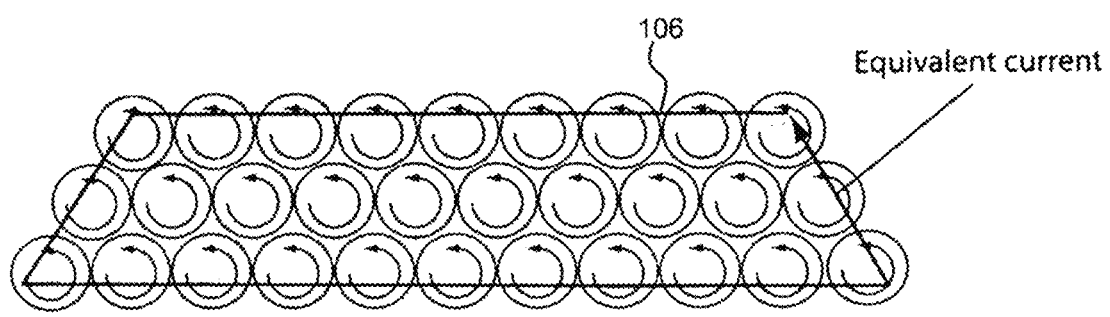
Figure 2A:
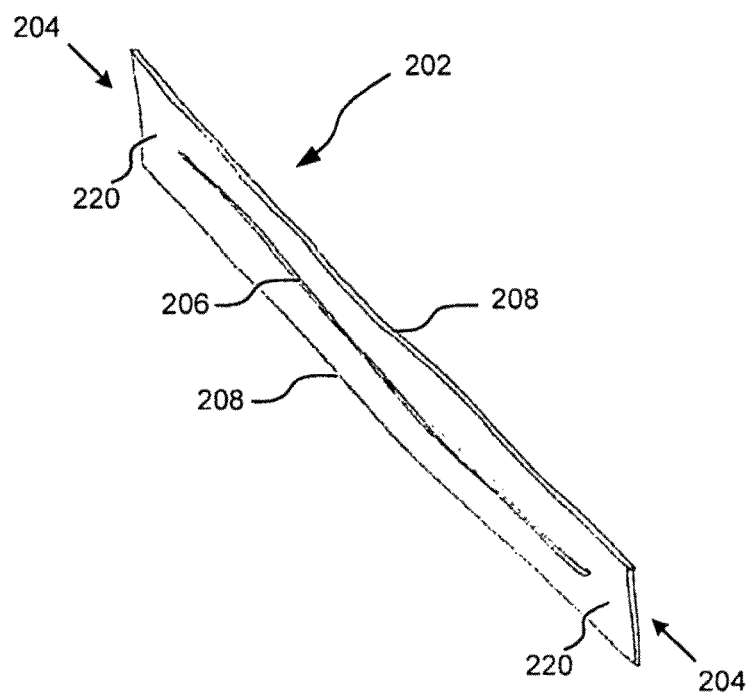
FIG. 2A shows a partially slit superconductor tape.

One embodiment of the present tape arrangements, which may be charged to form one of the present magnets, is the partially slit superconductor tape shown in FIG. 2A. The term "tape" in this disclosure means a tape-shaped structure. Thus, a "superconductor tape" is a superconducting material in the shape of tape (it need not have some kind of adhesive backing, like traditional tape), which may comprise, for example, YBCO or BSCCO and that are available commercially from, for example, American Superconductor, Superpower (Furakawa), Sumitomo, Nexans, and Bruker. The process can be used with any superconductor that can be deposited on a flat surface, and includes MgB2, NbTi and Nb3Sn, Nb3Al. The latter three are low temperature superconductors.

Figure 2B:
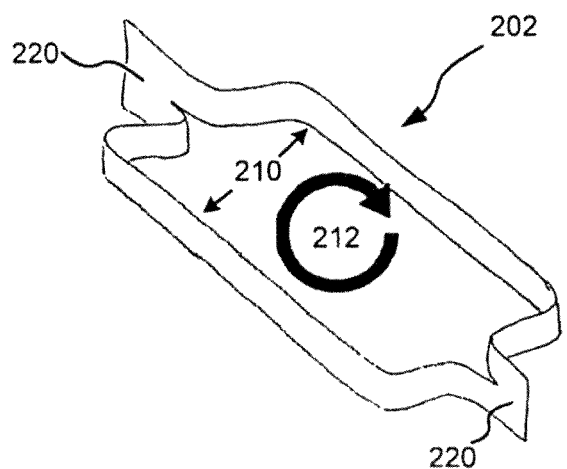
FIG. 2B shows the partially slit superconductor tape configured to make a loop.

FIG. 2A shows a superconductor tape 202 containing a slit 206 in its middle section that does not extend to ends 204 of the tape. The slit 206 forms two legs 208 in the tape that are located on either side of the slit, and two end tabs 220 that provide an electric shunt between leg 208 on one side of the slit to the other leg 208 on the other side of the slit. As shown in FIG. 2B, separation 210 separates the two legs 208 to form a loop 212. Because the material in the end tabs 220 is contiguous with each leg 208, the current flows from the leg 208 on one side of the slit to the other leg 208 at the other side of the slit. The material in the end tabs 220, like the material in the legs, is superconducting. Because the material between the slit and the end tabs 204 is contiguous with each leg 208, the legs 208 are connected through a superconductivity shunt (and, more specifically, a pair of superconductivity shunts), which eliminates the need of a splice. Thus, single tape 202 is topologically converted to a one-turn loop 212 which is superconducting, without a splice.

Figure 3A:
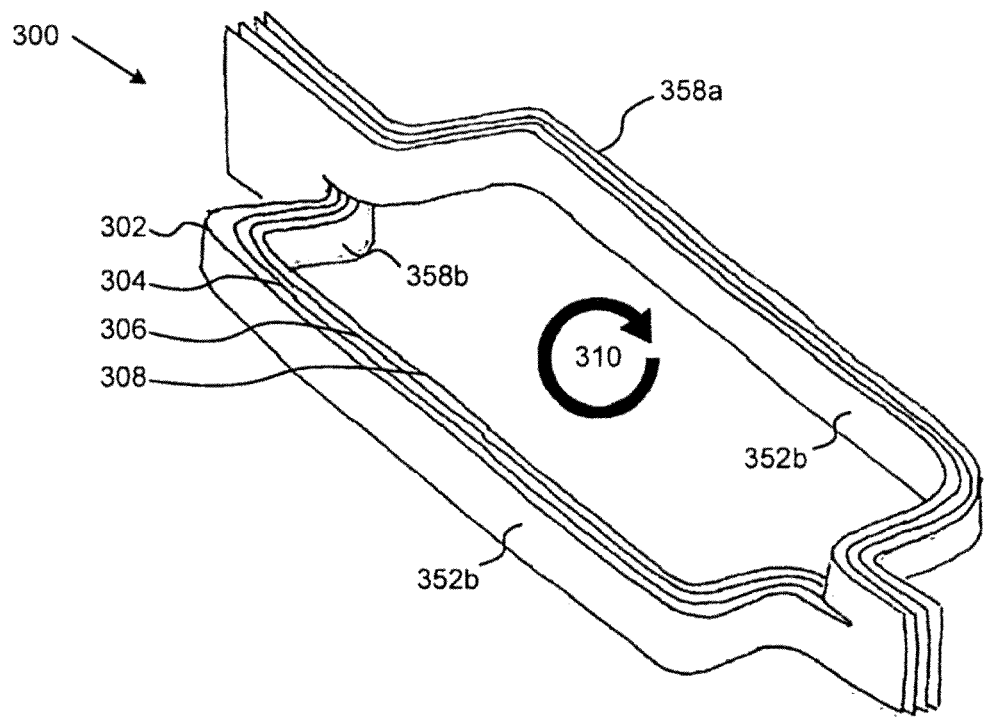
FIG. 3A shows a stack of partially slit superconductor tapes.

Other embodiments of the present tape arrangements, which may be charged to form one of the present magnets, include a group of partially slit tapes, such as those described above in connection with FIGS. 2A and 2B. For example, FIG. 3A shows a group 300 (which may be more particularly characterized as a stack) of partially slit tapes 302, 304, 306, and 308. Each partially slit tape of stack 300 has the characteristics of tape 202 described above. The stack 300 of partially slit tapes forms a multi-turn loop 310, which may have a higher current-carrying capacity than a one-turn loop formed with a single partially slit tape (such as one-turn loop 202) that has the same size as one of the tapes in the stack.

It should be noted that the tapes made from HTS material preferably do not have sharp bends or kinks, which may reduce the current carrying capability of the material. As such, smooth curves may be used to create a loop or other geometry using the HTS materials. FIGS. 2B and 3A show smooth curves used to deform the flat tape into a loop. In some embodiments, the radius of curvature of the tapes may be limited to a minimum of 12 mm (25 mm in diameter). Such minimum radii may be implemented with YBCO tapes.

Figure 3B:
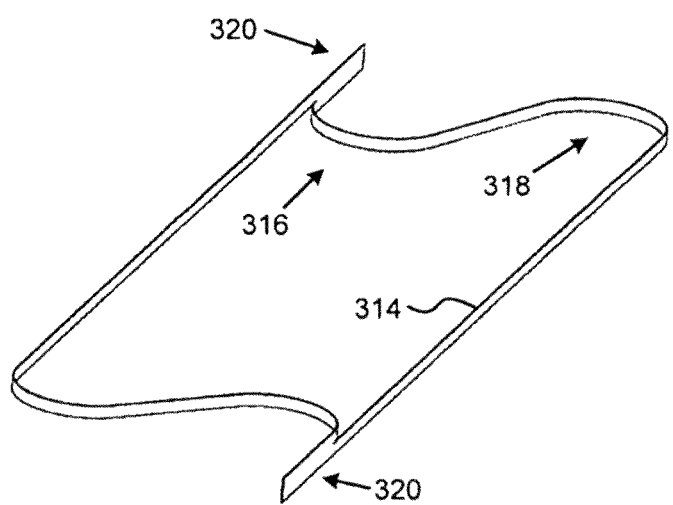
FIGS. 3B-3C show alternative configurations for partially slit superconductor tapes.
Figure 3C:
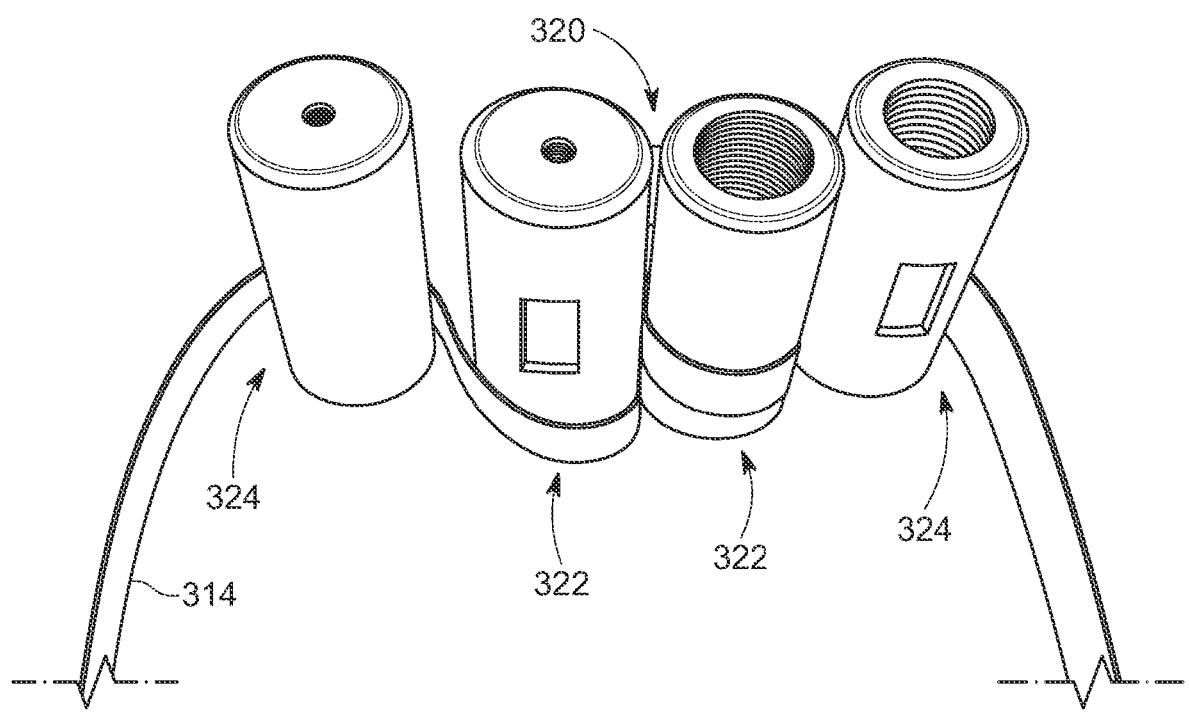

The end tabs, as shown in FIGS. 2A-3C may be configured to be as small as possible with minimal detrimental effect on the performance of the disclosed magnets. For example, the end tabs can be arranged to minimize a dead zone, which is a zone that generates little or no flux. The end tabs 220 in FIG. 2B extend the axial length of the superconductor tapes and do not generate much field or flux when in operation. However, the end tabs 220 are needed for current transfer between the leg 208 at one side of the slit and the leg 208 at the other side of the slit. Two arrangements that minimize the axial length of the loops while maintaining minimum curve radii are shown in FIGS. 3B-3C. In FIG. 3B, end tab 320 is aligned with a portion (and, more particularly, a major portion) of one of the legs 314 of the loop (meaning that the end tab of a given partially-slit tape and a portion of one of its respective legs substantially share a straight axis passing lengthwise through them), while another portion of that leg of that tape is arranged to include two curves 316 and 318, which may maximize the amount of flux and minimize the negative effect of the tab. Some embodiments of the present tape arrangements, which may be charged to form one of the present magnets, may include bent or curved portions in both legs—as shown in FIG. 3B—while in other embodiments, only one of the two legs of a given tape may contain such bent or curved portions. As shown in FIG. 3B, the bent portions in the legs of one of the partially slit tapes can be arranged so that a given group of bent portions is located on only one side of each tab. In other embodiments, as shown in FIG. 3C, the bent portions may be arranged on both sides of the tab. (Note that although the photograph in FIG. 3C shows cylinders that hold the tapes in the bent configuration, the cylinders may be omitted.) Specifically, the portion of each of the legs that begins proximate end tab 320 in FIG. 3C goes through a first curve 322 and then a second curve 324.

Figure 4A:
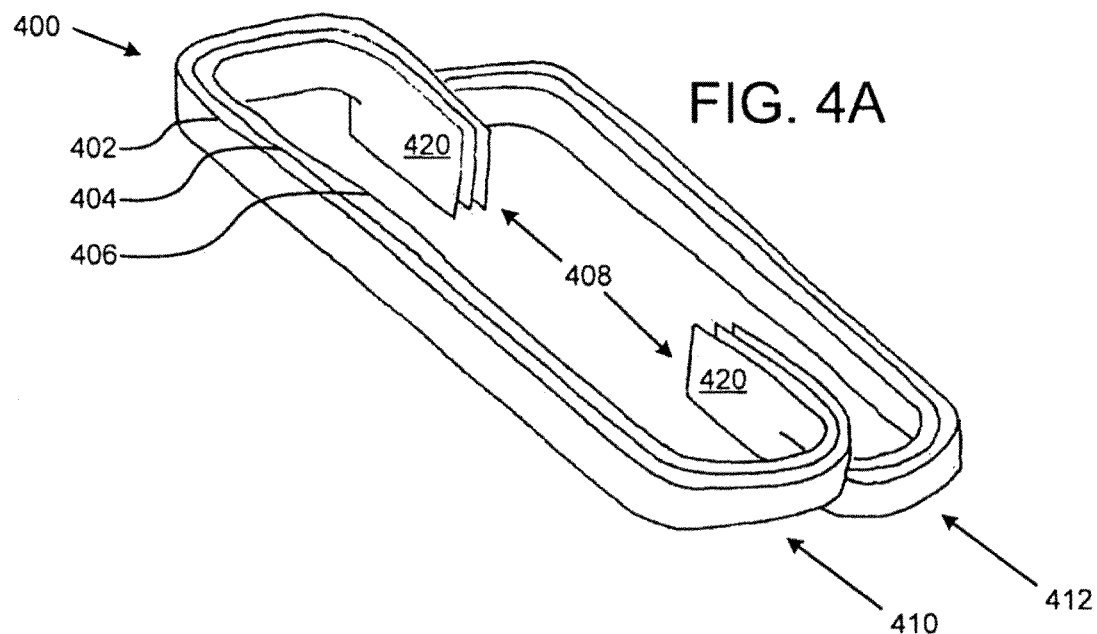
FIGS. 4A-4B show arrangements of tapes with the ends in the inside of the loop.
Figure 4B:
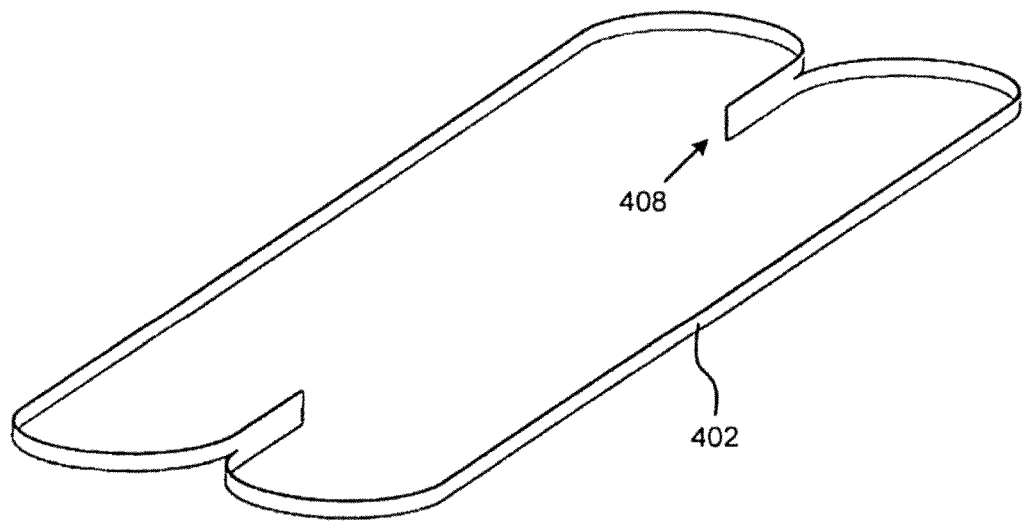

The end tabs 320 of the tapes shown in FIGS. 3A-3C are located outside the loop of the respective tapes. However, in other embodiments, the end tabs 320 are arranged inside of the perimeter defined by the outermost locations of the loop (and, more specifically, the outermost locations of the legs), as shown in FIG. 4A. FIG. 4A shows a stack 400 of partially slit tapes 402, 404, and 406 that form a loop. However, unlike the configurations in FIGS. 3A-3C, bends 410 and 412 place the ends 408 of the tapes (and also the end tabs 420) inside the loop. In this configuration, the perimeter defined by the outermost locations of the loop can have almost any shape, from near circular to near elliptical or any other configuration (including triangular, or 4-petal arrangement), while the ends 408 and the associated end tabs 420 are located inside the perimeter. The perimeter defined by the outermost locations of the loops shown in FIGS. 3A-3C can also have substantially any shape, while the ends (and the end tabs) are located outside the perimeter. FIG. 4B shows a configuration similar to that shown in FIG. 4A, with an end 408 inside the perimeter, but with a single partially slit tape 402.

Figure 5A:
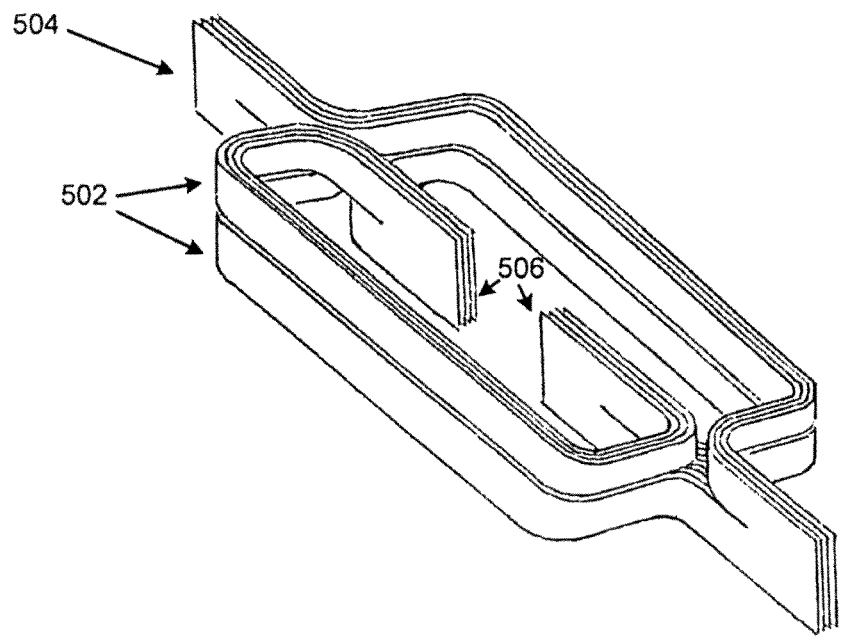
FIG. 5A shows an arrangement combining a stack having external ends with a stack having internal ends, which achieves a nearly symmetrical coil arrangement.

For high current, high field applications, the tape arrangements shown in FIGS. 3A-3C and 4A-4B may not be the most advantageous because they do not possess a certain symmetry in that, while the legs are formed from a single piece of tape, one leg will be above or below the other leg. For example, in stack 300 shown in FIG. 3A, all the legs below the slits are on one side of the loop and all the legs above the slits are on the other side of the loop. FIG. 5A shows an alternative arrangement that possess the symmetry that stacks 300 and 400 lack. As shown in FIG. 5A, two stacks 502 are used to form one of the present magnets, one with the ends 506 of one stack 502 inside the perimeter of the loop, while the ends 504 of the second stack 502 are located outside the perimeter of the loop (or, outside the loop). The symmetry in the legs of the loop in FIG. 5A is important, for example, when the permanent magnet made from HTS tapes is embedded in a magnetic field that is essentially symmetrical about a center of the tapes. In this case, if the tapes are not symmetrical, the tape assembly may experience forces that tend to rotate the loops in one direction. A symmetrical tape arrangement may help minimize these forces in a symmetric field.

Figure 5B:
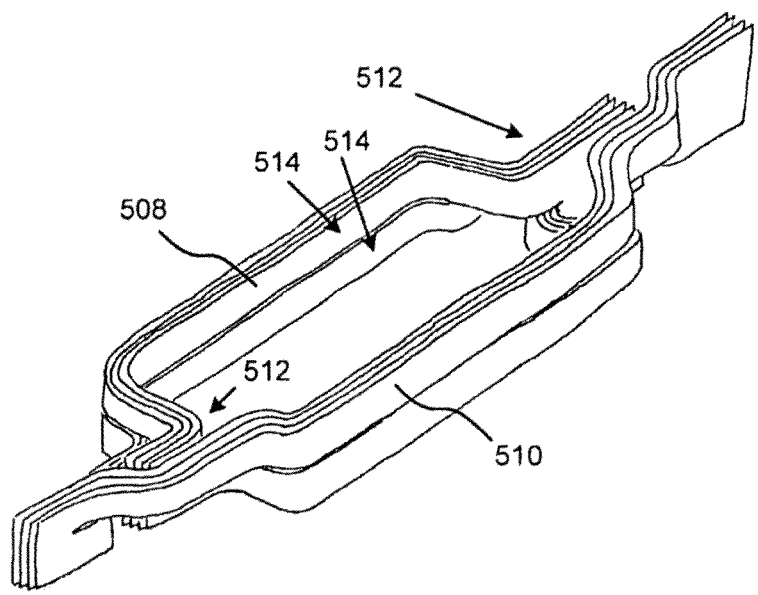
FIG. 5B shows an arrangement combining two stacks made of tapes of different lengths and having external ends.

In some embodiments, such as that shown in FIG. 5B, tapes of different lengths may be used to achieve a symmetrical configuration. FIG. 5B shows two tape stacks, 508 and 510, where tape stack 510 is made from longer tapes that tape stack 508. The ends tabs 512 of tape stack 508 are positioned inside tape stack 510. In this geometry, the interference between the upper and lower legs, in the region of the ends, is avoided by having one entire stack inside the other. On one side of the loop, the first stack 508 has tapes 514 on top, while the second stack 520 has tapes 5514 on the bottom. In the opposite side of the loop, stack 508 has tapes on bottom, while stack 510 has tapes on top. In this manner the legs of the loop are symmetrical. As discussed in connection with FIGS. 4A-B, one feature of symmetry is that forces are symmetric, and in a lot of cases, the net torque may be negligible or zero.

Figure 6A:
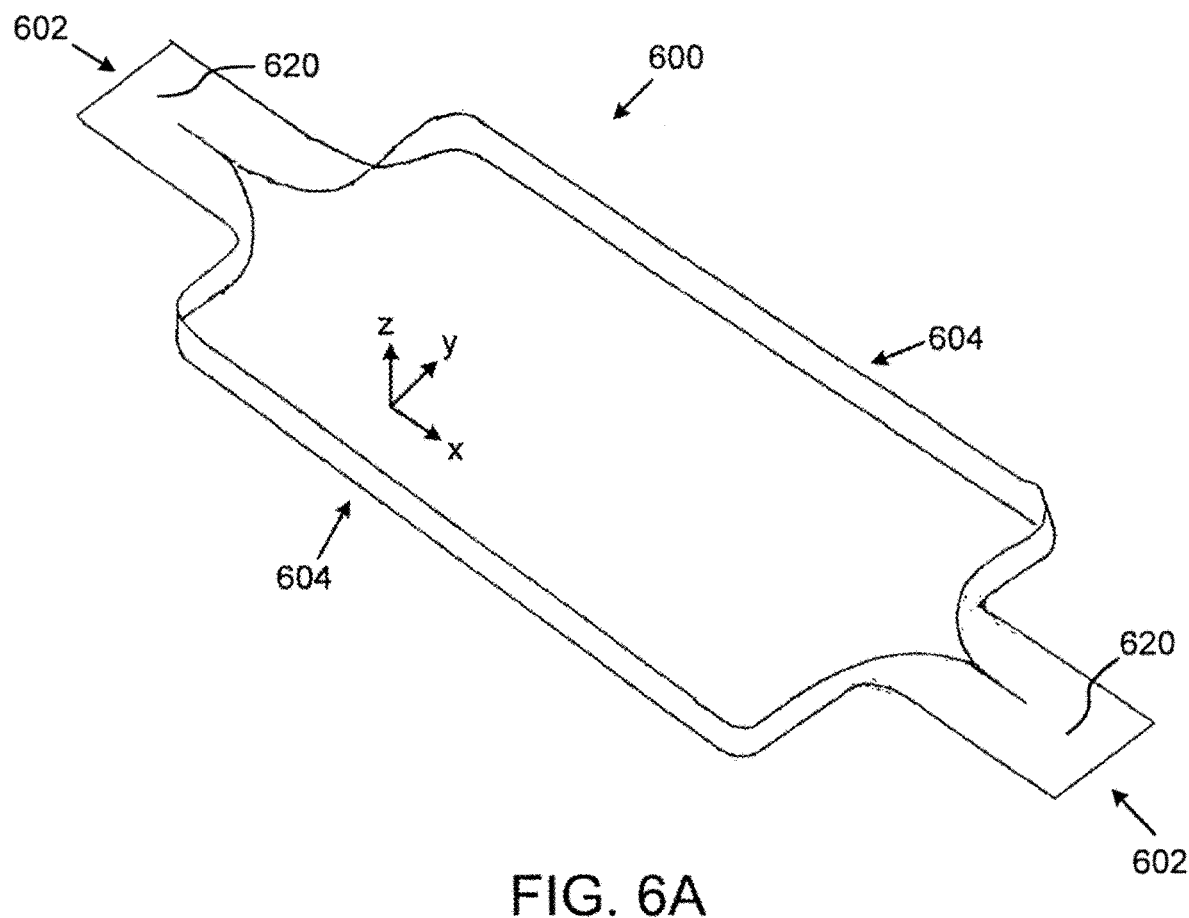
FIG. 6A shows an arrangement of a partially slit superconductor tape, where the tape is bent in multiple axes.
Figure 6B:
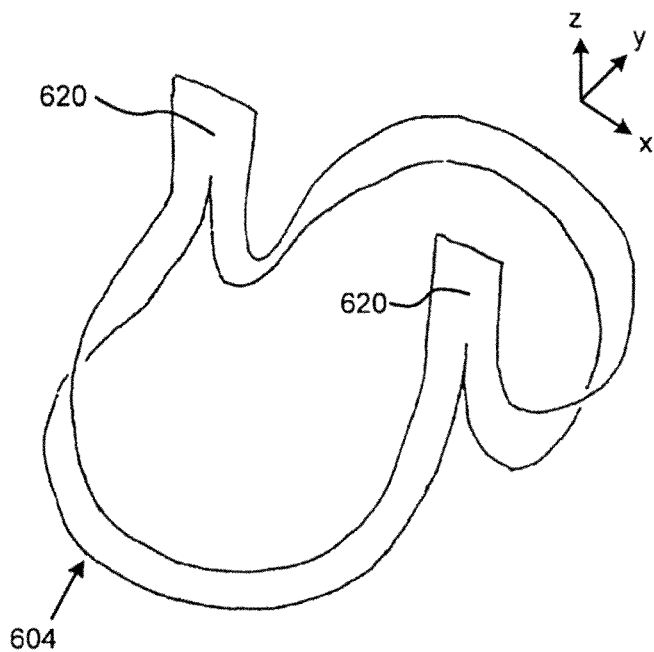
FIGS. 6B-6E show alternative arrangements of partially slit superconductor tapes.
Figure 6C:
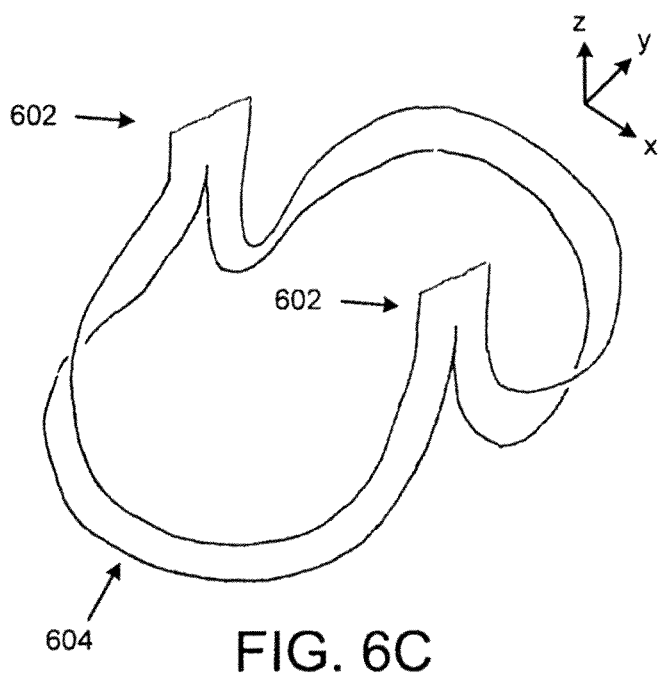

Another embodiment of the present tape arrangements, which may be charged to form one of the present magnets, is shown in FIGS. 6A-6C. In this arrangement of a partially-slit tape, the end tabs 620 are oriented substantially perpendicular to the legs 604. In the arrangement shown in FIG. 6A each end 602 (and end tab 620) is placed or positioned horizontally (in the y direction) and a portion (more specifically, a major portion) of the legs 604 is placed or positioned vertically (in the z direction). Although ends 602 (and the end tabs 620) are shown in FIG. 6A as being outside the perimeter of the loop, in other embodiments, the ends may be inside the perimeter of the loop. The type of symmetry possessed by the configuration of the partially-slit tape shown in FIG. 6A helps to minimize out-of-plane loads (torques) during the charging operation.

In other configurations, shown in FIGS. 6B-6C, the end tabs 620 and legs 604 are positioned in the vertical direction. In this manner, the end tabs 620 are in the vertical direction, but the main loop is in the horizontal plane, thus minimizing the required radial extension. This geometry would allow the loop to be introduced, for example, into the cylindrical bore of a magnet. In addition, the vertical extension of the legs 604 and end tabs 620 could be sufficient to place the end tabs appreciably outside the loop. The vertical end tabs 620 can be placed either radially, as shown in FIG. 6B or azimuthally, as shown in FIG. 6C.

Figure 6D:
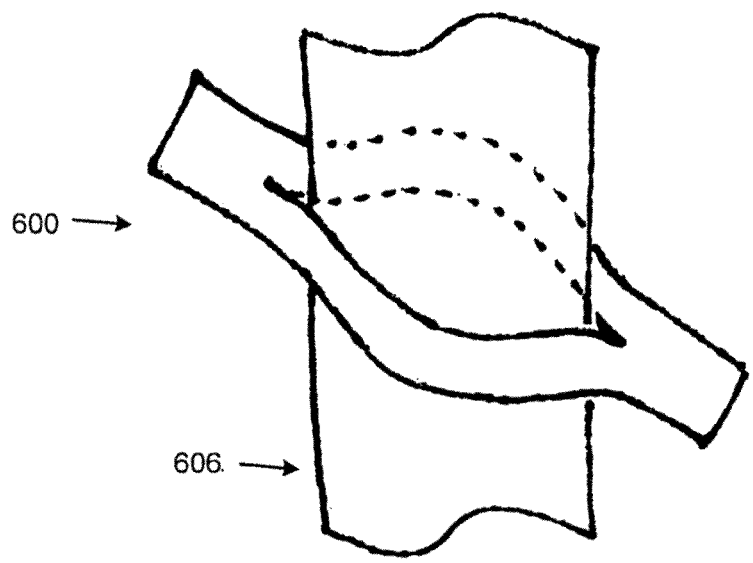
Figure 6E:
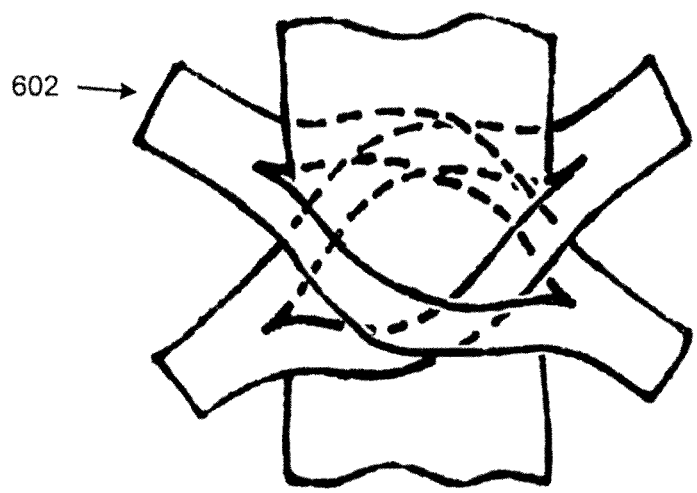

In yet other arrangements, as shown in FIGS. 6D and 6E, the axis of a loop made by a partially-slit tape is at an angle with respect to a cylinder that it surrounds. Any angle is possible, although 45 degrees provides for some symmetry. The non-vertical fields that the loop shown in FIG. 6D generates can be balanced by a second loop (a second partially-slit tape), as shown in FIG. 6E. Although FIGS. 6A-6D show a single slit tape, it should be understood that such configurations may also use tape stacks.

Figure 7:
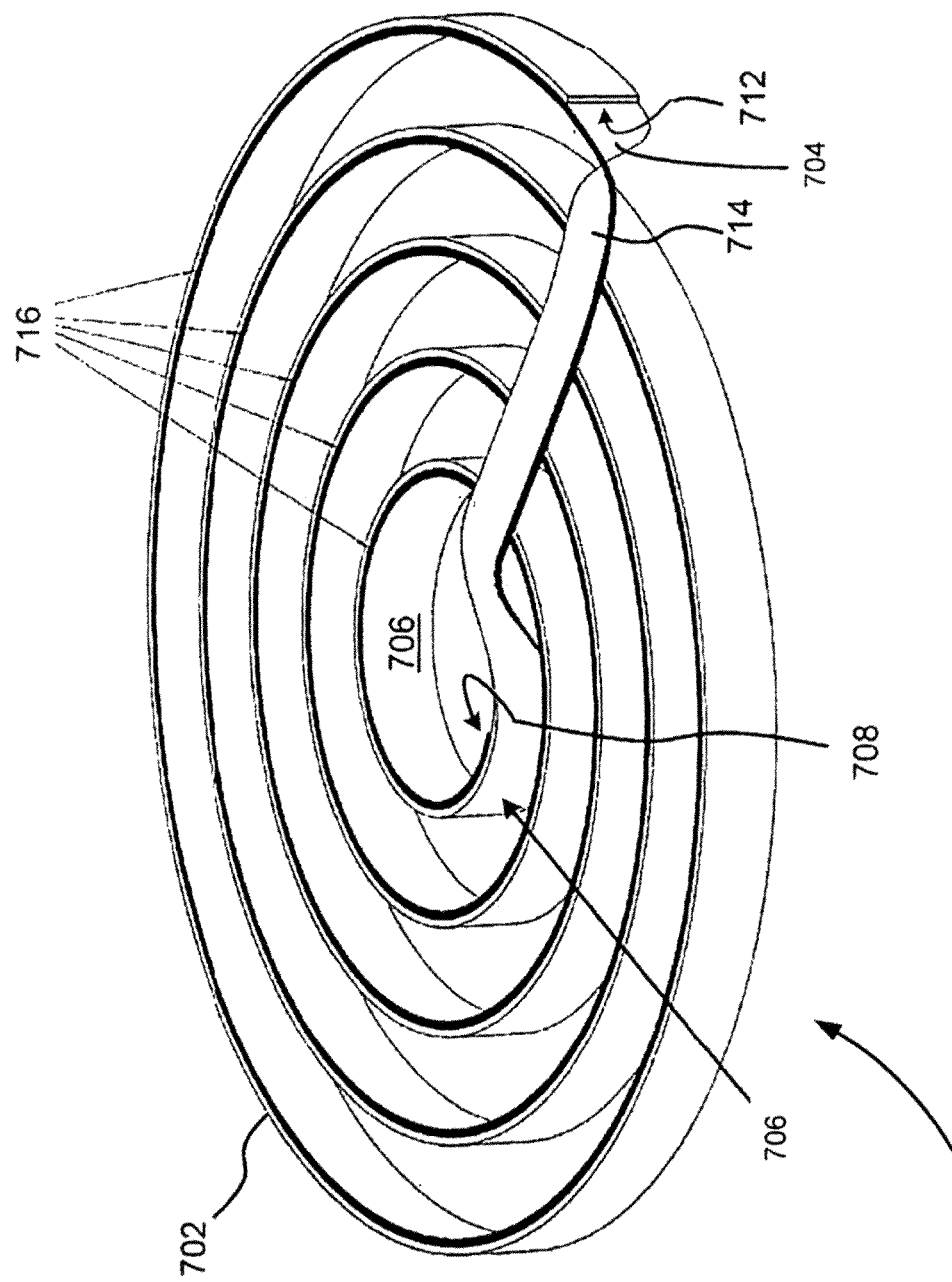
FIG. 7 shows a multi-turn coil made from a single tape that is shorted to itself.

An alternative embodiment to those shown in FIGS. 2A-6E is shown in FIG. 7, where a non-slit tape 702 is wound into a multiple-turn coil 701. Tape 702 (which may comprise superconducting tape 902 shown in FIG. 9B) has a tape beginning 708 and a tape end 712, as well as a first side 706 and a second side 704, which is opposite first side 706. One edge of tape 702 has been blackened to make its position easier to follow. It should be noted that the superconducting side of the tape, in the case of YBCO (second generation tapes), is only on one side of the tape and that internal to the tape there are highly resistive and insulating elements that make the two sides of the tapes very different electrically.

Tape 702 of coil 701 is arranged to overlap itself for a majority of the length of the tape. This is accomplished using a twist at the location between element number 714 and where second side 704 is denoted. The twist allows tape 702 to be in contact with itself-superconducting side soldered to superconducting side (second side 704-to-second side 704, in this embodiment)—over a majority of its length. Locations 716 are examples of locations where one edge of tape 702 (blackened) is positioned alongside the opposing edge of tape 702. The single tape portion that spans the portion of coil 701 in which tape 702 overlaps itself may be characterized as a splice or splice portion, and the remaining portion 714 of coil 701 may be characterized as the shunt (or non-overlapping) portion. The portions of tape 702 that make up the splice portion of coil 701 may be coupled together in superconducting side-to-superconducting side fashion using any suitable high quality solder, such as 40Pb-60Sn solder, or low temperature solder than contains indium. The smaller the resistance of the splice of coil 701, the smaller the droop of the field/current over time. It has been determined that such resistance of YBCO tape is on the order of 30 nano-Ohms per square centimeter. Preferably, the splice of a given embodiment of the present coils should be as long as possible to minimize the contact resistance.

Alternatively, instead of second generation tapes, like superconducting tape 902, magnesium diboride ($MgB_2$) tapes or strands, or BSSCO tapes, can be used. As a result, the twist shown in FIG. 7 need not be used because the tape would be symmetrical.

The decay of the field in a trapped field magnet depends on the parameter L/R, where L is the inductance of the coil and R is the resistance. The inductance is determined by the stored energy in the magnetic circuit (including the iron, if there is some) and the current in the coil. For a typical large motor application, where the area of the loop is about 500 cm² in a magnetic circuit with a 1 mm gap, the inductances for 30 turns is about 5 milliHenries. In this case, the time constant for 1/e droop in the current/field is between about 1 and 2 years. If the coils are re-energized every few months, it is possible to limit the droop in field to about 10%. For a longer time between the loop recharging, it would be preferable to develop joints with lower resistance or more inductive coils (such as with a lower current in the winding, and an increased number of turns).

Some embodiments of the present magnets include a coil wound from a relatively long tape (such as that shown in FIG. 7). Although; it may be possible to drive such a magnet with current provided/controlled by an external power supply, such a configuration would require current leads. For a large number of superconducting coils, the cryogenic load (the amount of refrigeration needed) is dominated by the current leads, so avoiding their use decreases the cryogenic load and the size of the required refrigerator. For rotating machinery, the current leads would also include a sliding joint, which would be resistive. By trapping a magnetic field in a superconductor tape with external coils, sliding joints, as well as the current leads, are eliminated. In some applications, such as charging a coil that is in a rotor, it may be possible that joints would still be used. However, the joints may be activated only during maintenance operation if the droop of the current/field is small enough.

Figure 8:
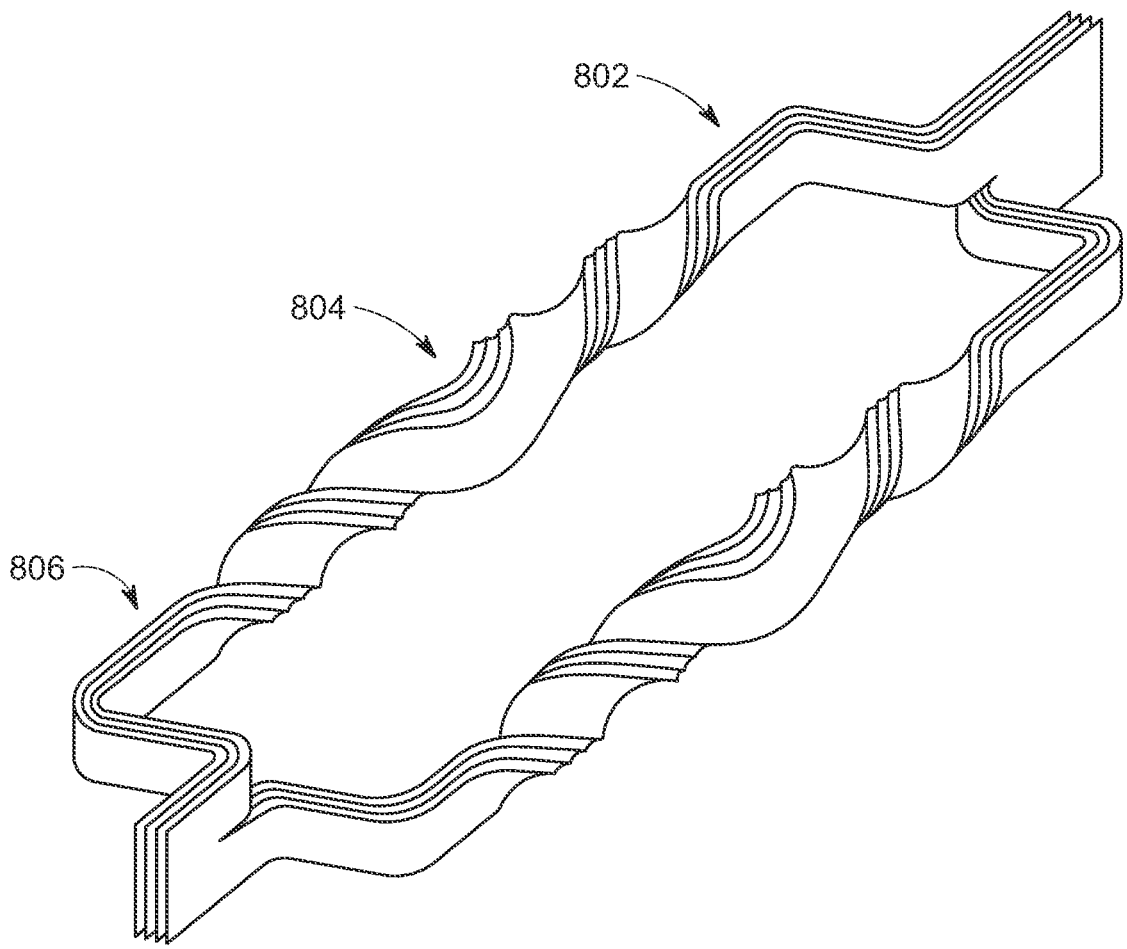
FIG. 8 shows a configuration that provides limited transposition of the tapes.

In the embodiments of partially slit tape and shorted wound coil shown in FIGS. 2A-7, the tapes in the coils/loops are transposed in that the tape in the outermost loop in one leg, is in the innermost loop in the other leg. This transposition can be clearly seen in FIG. 3A, where, for example, the leg of the tape 358a is in the outer most tape in this leg, while the continuation of this tape in the other leg, tape 358b, is in the innermost region. It is possible to provide additional transposition by twisting the tape assembly, as shown in FIG. 8. In particular, placing a twist, as is shown of the stack of tapes in FIG. 8 between section 802 and 804, will provide additional transposition. In this case, the twist reverses—it turns in one direction between sections 802 and 804 and it turn in the opposite direction between sections 804 and 806. The result is limited transposition, but not full transposition, as the tape or tapes inside of the outer tapes remains in its/their central position. One or more than one twist can be applied, especially when the loop is high aspect ratio (that is, when the length of the loop is large compared with the width/height of the tape stack).

Figure 9A:
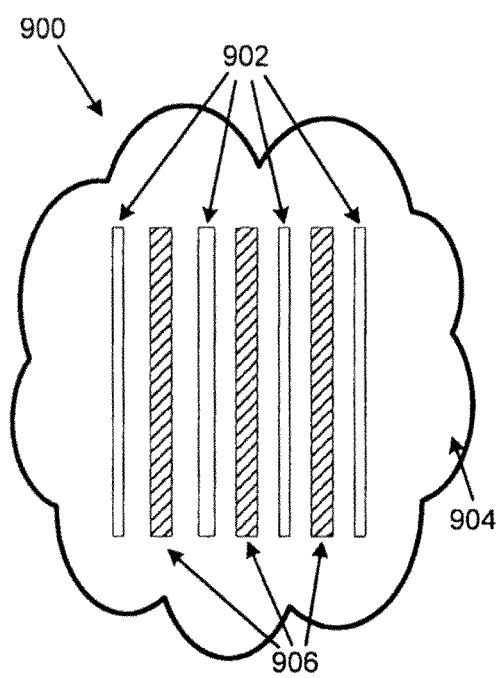
FIGS. 9A-9B show a composite with superconductor tapes, reinforcement, and additional material for increased heat capacity.
Figure 9B:
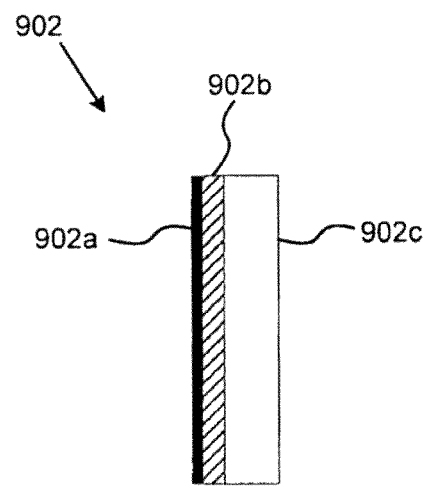

FIG. 9A shows tape composite 900, which is another embodiment of the present tape arrays or stacks. Superconductor tapes 902 of composite 900 comprise mostly substrate (e.g., a nickel-based material) and may also comprise some copper. For example, as shown in FIG. 9B, superconductor tape 902 may include superconducting film 902a, insulator 902b, and substrate 902c. The YBCO superconducting tapes have a built-in insulator 902b between the superconducting film 902a and the nickel-based substrate 902c, limiting the current transfer from tape to tape in the case of an electrically conducting medium between the tapes, such as solder. The current would transfer from tape to tape through the edges of the tapes where there is copper/solder shunting from one side of the tape to the other. In embodiments that use composites like those shown in FIG. 9A, with superconducting tapes 902 embedded inside a composite, it is possible to have metal strips 906 made of copper or other highly-conducting elements in the composite as long as the conducting elements 906 are not in direct electrical contact with the superconductor or otherwise form a loop or loops that can buck changes in magnetic field during charging. Such conducting element 906 can be placed next to the superconductor with thermally conducting insulation in between them. Alternatively, tape composite 900 may include a non-metallic material dispersed reinforcement 906, which may comprise, for example, a dielectric material, such as polyethylene or polypropylene, which has good heat capacity but low thermal conductivity. The filler 904 can be a relatively low melting temperature solder such as, for example, indium, bismuth base, or lead-tin solders, or an epoxy or another organic(s). Some suitable epoxy compounds for filler 904 include Stycast, Epon, and Ecobond, which have relatively high thermal conductivities. Thus the composite 900 may include the superconducting tapes 902, other material 906 for structural, electrical or thermal management issues, and a filler 904, making it a hybrid composite. Additional material 906 may provide additional strength, increased thermal conductivity, and/or increased heat capacity. The latter two characteristics may help to minimize a temperature excursion in superconductor tapes 902 during the charging process, which is described below.

Using impregnation with either solder or epoxies 904 supports the tapes and may yield composites 900 that are easier to handle than a relatively flexible stack of tapes. The impregnation/solder can be accomplished with the tape stacks in a trough that is then filled with epoxy or solder, which may provide support when the loop is energized.

More broadly, any of the present tape stacks or tape arrays can be impregnated in order to provide structural support and to make handling easier. For example, they can be impregnated with an epoxy suitable for operation at cryogenic temperature, such as some types of Stycast, and having a coefficient of expansion that approximately matches the coefficient of expansion of the slit tapes. An alternative is to apply solder to the tape stack with a conducting material. Conducting material can be used in the tape stack/array in the case of pulsed charging as long as the resistivity of the material is substantially small so that the current induced in the conducting filling material decays during the charging process.

Figure 10A:
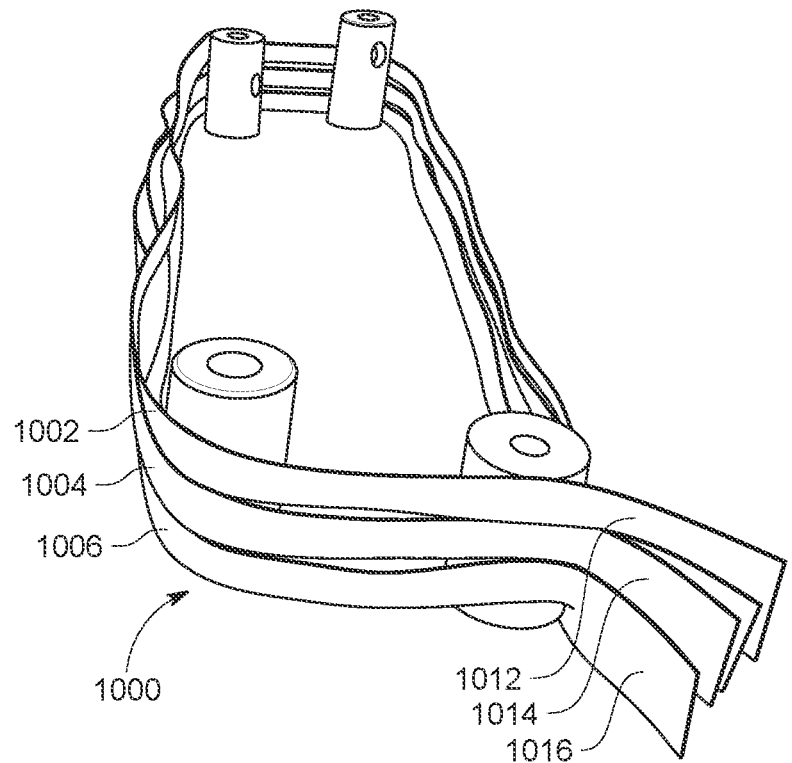
FIGS. 10A-10B are photographs showing an array of stacked tapes.
Figure 10B:
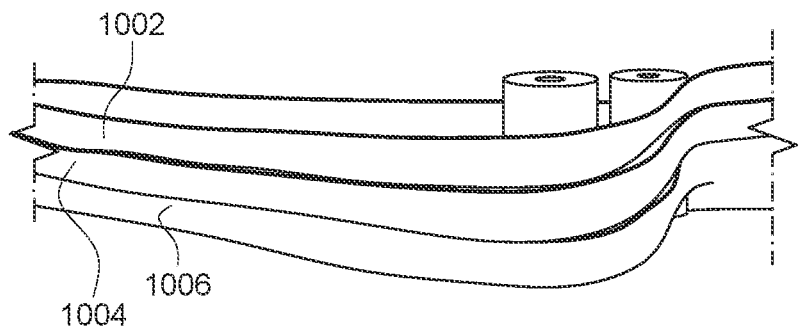

FIGS. 10A-10B show another embodiment of the present tape arrangements. Array 1000 includes partially-slit tapes 1002, 1004, and 1006, each of which has the same features as tape 202 described above. At least some of the legs (and, as depicted, one group of comparably positioned legs) of the tapes can be nested within each other, as described above in FIG. 3A, and stacked up, such that a portion of an edge of each leg in the group partially overlaps a portion of another leg in the group, to create an array as shown in FIGS. 10A-10B. (Note that although the photographs in FIGS. 10A-10B show cylinders that help hold the tapes in the bent configuration, the cylinders may be omitted.) In FIG. 10A, there are three stacking levels, and although at each level there are only two tapes, in some embodiments, each level may include multiple (e.g., a stack of) tapes. Although the end tabs of the tapes (such as labeled regions 1012, 1014, and 1016, respectively, of tapes 1002, 1004, and 1006) in FIG. 10A are located outside the loop, it is possible to arrange (e.g., stack) the tapes so that some or all of the regions are arranged inside of the perimeter defined by the outermost locations of the loop, or to arrange the stack of partially overlapping tapes to have any of the loop and region shapes disclosed in the other figures of this disclosure.

Figure 11A:
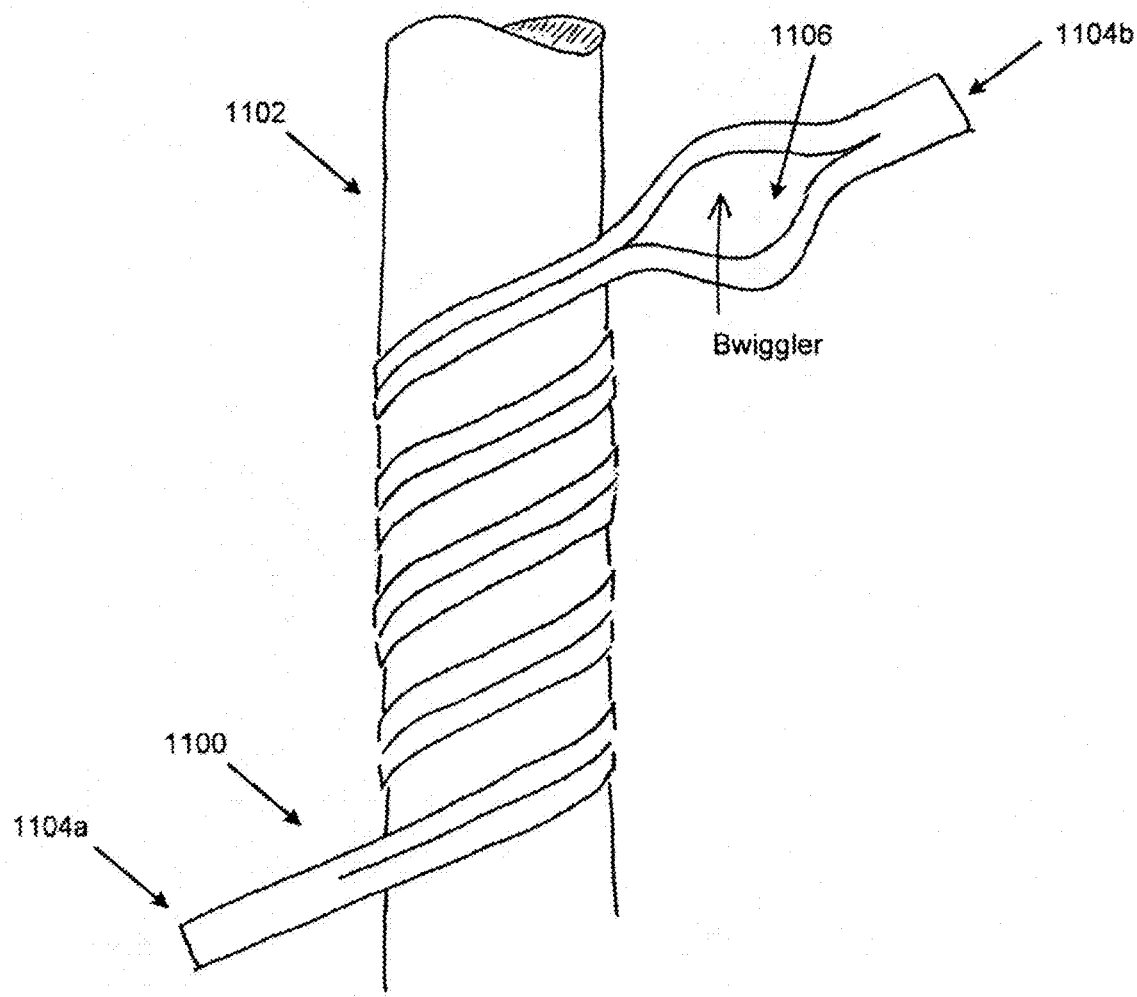
FIG. 11A shows a partially slit tape wound around a cylinder.
Figure 11B:
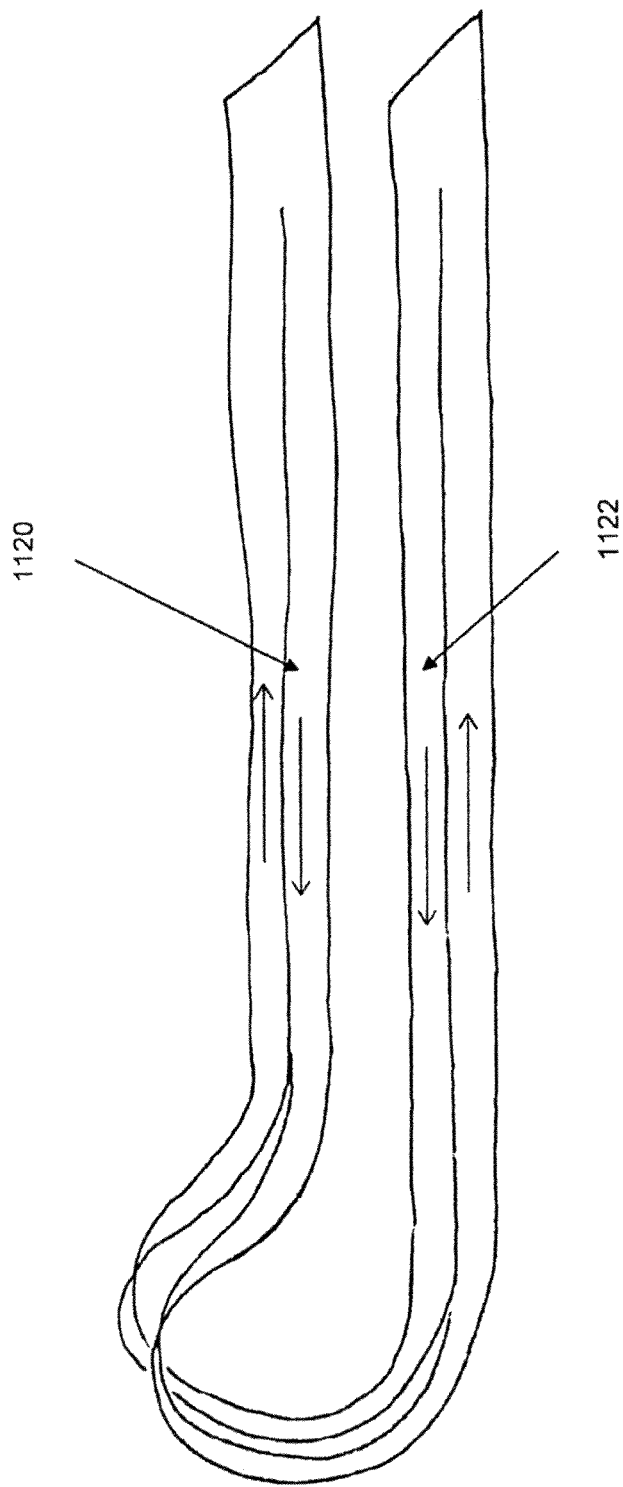
FIG. 11B shows a partially slit tape where portions of the legs are in a common plane.

There are many other configurations possible with the use of the partially slit tapes. FIG. 11A shows a different application, one that can be used to generate multi-pole fields, useful for anything from undulators to arrays for magnets used for levitation (e.g., for devices such as MAG-LEV). The example in FIG. 11A shows one embodiment that may be used in an undulator/wiggler coil. The slit tape 1100 is wound on a cylinder 1102, with one or both ends 1104a and 1104b sticking out. A loop 1106 is made at one or both ends. Current flows in opposite direction on tapes on either side of the slit, providing a multi-pole field. In FIG. 11A, the current in the tapes may be determined by an externally applied field $B_{wiggler}$ at loop 1106, and may be applied to only one of the ends of the slit tape or both ends. Multiple tapes (e.g. stacks or arrays) can be used. Also, there may be an axial field in these magnets that is aligned with a central axis of cylinder 1102. The axial field can be used to generate the current through the loop 1106, and in that case, the current through loop will be proportional to the applied field (until the tapes reach critical conditions). The array illustrated in FIG. 11A contains 5 turns of the slit tape 1100 around cylinder 1102. The gap between turns of the tape can be reduced so that the turns of the tape are near each other by adjusting the twist pitch of the slit tape. It is also clear that the charging loop 1106 at the end of slit tape can be substantially removed from the cylinder 1102. Although the arrangement described in FIG. 11A is cylindrical, plane arrays may also be implemented. For example, FIG. 11B shows an embodiment of a plane array. The arrangement in FIG. 11B places legs 1120 and 1122 having current flowing in the same direction next to each other and in substantially parallel planes. FIG. 11B also indicates the direction of current flow in the legs of the partially-slit tape. Although there is no charging loop shown in the figure, one or more may be included. In addition, although this embodiment shows a single tape, a tape stack may also be arranged in a plane array. In some embodiments, the tapes are arranged so that current in adjacent elements flows in opposite directions.

Embodiments of the present magnets include any of the tape arrangements described in this disclosure in which a magnetic field has been trapped. The process of trapping the magnetic field may be referred to as "charging" the superconductor tape. A charged superconductor tape is referred to as a tape trapped field magnet (TTFM). By comparison, a monolithic superconductor with a trapped magnetic field is referred to as a trapped field magnet (TFM).

In addition to the embodiments disclosed above, one may manufacture a loop with superconducting tape without a splice (or overlapping portion) and also with a slit. Such loops may be characterized as continuous loops or as spliceless (or non-overlapping), continuous loops. One embodiment of such a loop comprises a ribbon/loop of the substrate or tape, with one or more superconducting materials and one or more ceramic materials deposited (e.g., continuously and epitaxially) on the looping substrate, having ends that are joined, such as using a weld. In such embodiments, the metallurgy around the joint (e.g., the weld) will be different from the metallurgy of the rest of the tape, which may prevent the deposition of high quality superconducting material on the region around the joint. Another embodiment of the present continuous loops comprises extruded material with no joined ends. One may make such a looping substrate is through an extrusion process (e.g., using a cylinder/disk with a hole in the middle to drive material through a die having a loop-shaped opening). Using extrusion could produce texturing in the substrate, such as through the rolling-assisted biaxially-textured substrate process (RABiTS).

Once made, the loop may be placed in a reel-to-reel system, and processed through a Chemical Vapor Deposition (CVD) reactor, with the loop material moving through the deposition region of the reactor. The process starts at one point of the loop, and the loop is moved through the reactor until the section first treated reaches the reactor. Where the loop is extruded with texture, the texture can help align the deposited superconducting material (e.g., YBCO). As a result, the superconducting properties of the loop can be substantially continuous along the loop. It is possible to make multiple transits through the reactor. Thus, any portion of the tape may move through the reactor multiple times.

Figure 18:
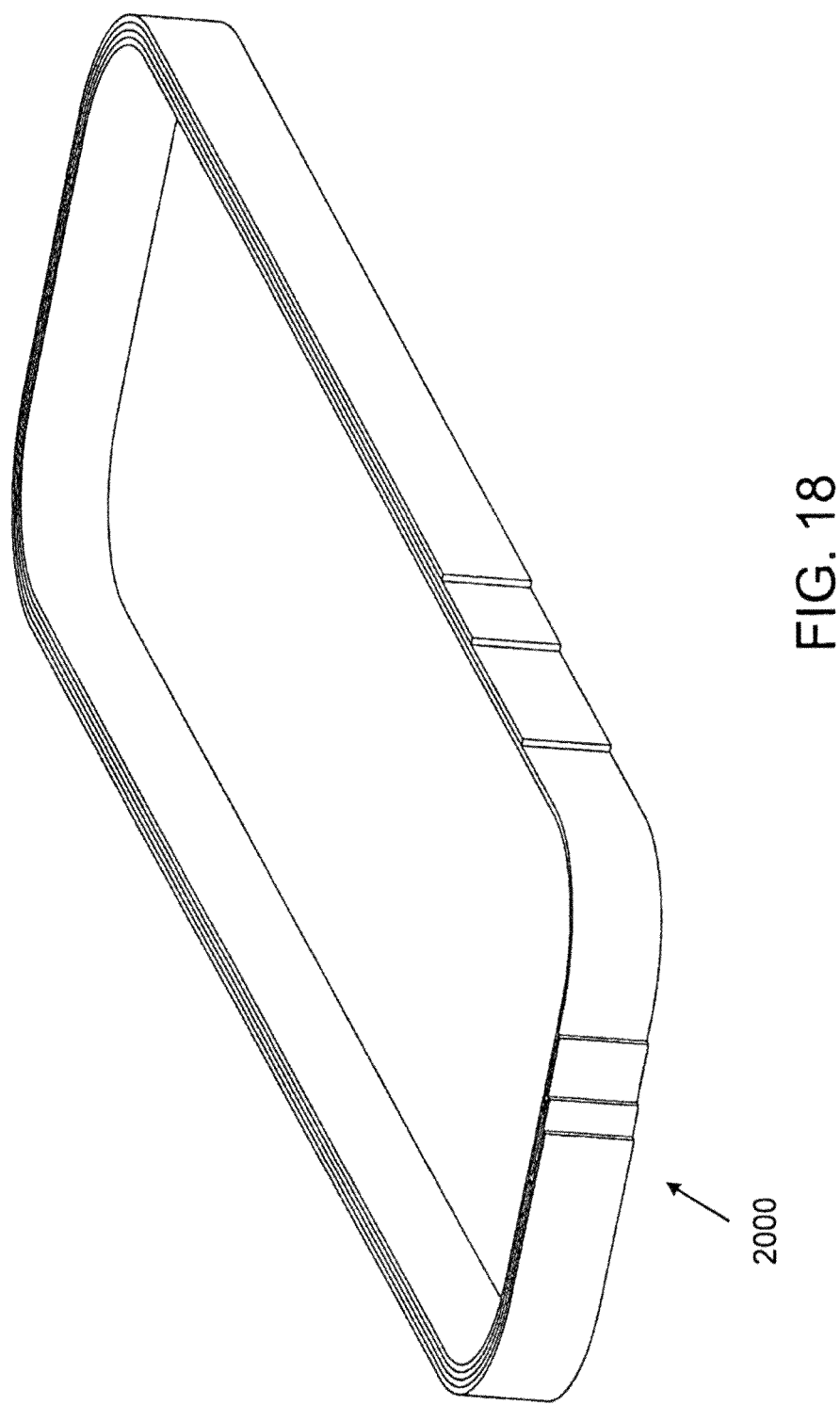
FIG. 18 shows multiple continuous loop tapes arranged into a tape stack, which is one of the present tape arrangements.

In some superconductor manufacturing processes, the superconducting materials may be deposited on substrates that are not textured. For example, an ion beam (e.g. Ion Beam Assisted Deposition, or IBAD) may be used for texturing the layers deposited in the reactor on an untextured substrate. In this case, the different metallurgy in the region of the weld (where the loop comprises a tape having joined ends) may not prevent the deposition of superconductor material on that region. FIG. 18 shows tape arrangement 2000, which is an example of one of the present tape arrangements that can be produced in this manner. Layers of the tapes are shown in broken form so as to make their existence more clear.

One benefit of using tapes made from looping substrates is that the loops do not have the end or the end tabs of slit tapes. The methods of energizing the looping substrate tapes are similar to those of slit tapes, and are described below.

The schematic flow chart diagrams that follow are generally set forth as logical flow chart diagrams. As such, the depicted order and labeled steps are indicative of embodiments of the presented methods. Other steps and methods may be conceived that are equivalent in function, logic, or effect to one or more steps, or portions thereof, of the illustrated methods. Although arrows are employed in the flow chart diagrams, they are understood not to limit the scope of the corresponding methods. Indeed, some arrows or other connectors may be used to indicate only the logical flow of the depicted method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 12:
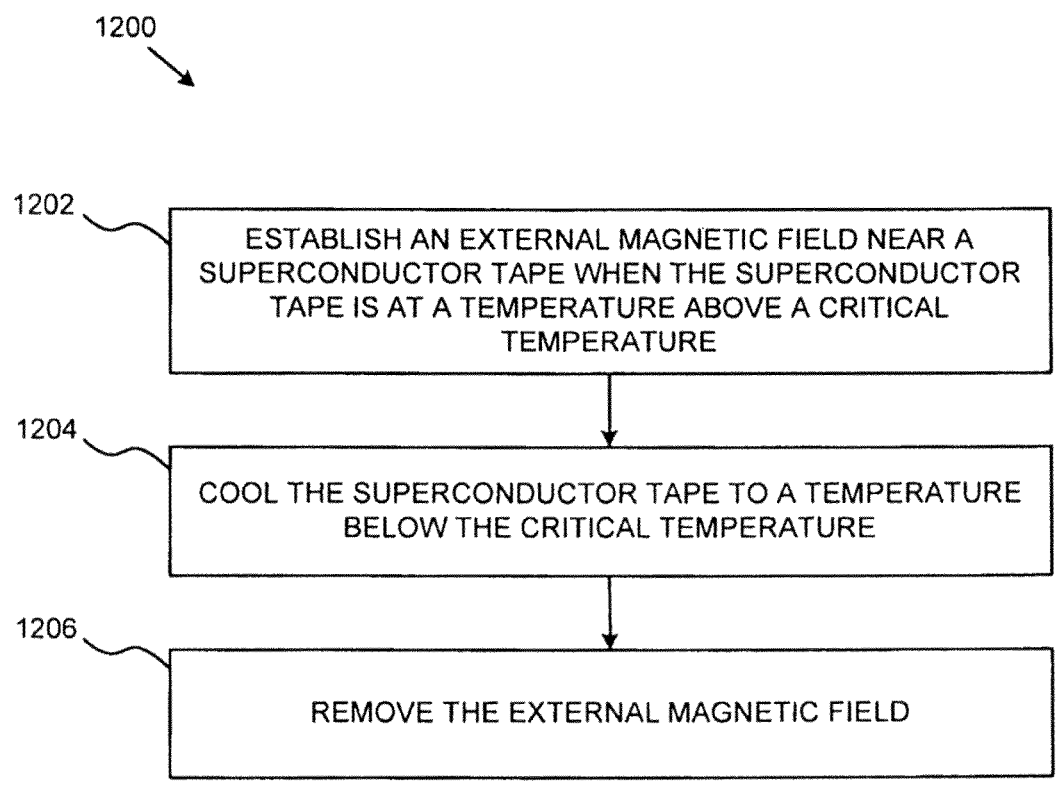
FIGS. 12-14 show flow charts for methods of trapping a magnetic field in a superconductor tape.

There are various methods for charging the present tapes and tape arrangements. Three embodiments of such methods are described below. First, TTFMs can be charged (which is shorthand for "a tape can be charged to become a TTFM") by field freezing. FIG. 12 shows one embodiment for charging a TTFM using field freezing. At step 1202 of field freezing method 1200, a magnetic field is established with external coils while the TTFM is above the critical temperature of the TTFM. At step 1204, the TTFM is then cooled below the critical temperature. At step 1206, the magnetic field is removed. The flux inside the superconducting loops is preserved by current induced in the tapes by the decreasing external magnetic fields. For magnets that comprise multiple tapes arranged as set forth in, e.g., FIGS. 3A-5, the current may first flow in portions of the innermost two legs of the tapes, such as legs 352a (of tape 302) and 358a (of tape 308) of stack 300 shown in FIG. 3A. Stack 300 shows an example of the type of transposition (e.g., limited transposition, without twisting) that allows for such initial current flow, where the outermost legs of stack 300 include leg 352a of tape 302 (other leg 352b of which is the innermost leg in the other side of the arrangement) and leg 358a of tape 308

(other leg 358b of which is the innermost leg of the other side of the arrangement). In the multi-tape arrangements of the depicted embodiments, the innermost legs are from different tapes, as are the outermost legs, including for stacks in which the end tabs are inside the perimeter defined by other outmost locations of the loop as well as the stacks in which the end tabs are outside the loop. Such multi-tape arrangements are examples of arrangements having an outer perimeter defined by legs of two different superconductor tapes and an inner perimeter defined by legs of two different superconductor tapes. With field freezing, current is induced in all the tapes of a given multi-tape arrangement as the field is being reduced. As the outermost tapes are reaching critical current, flux will move to the next set of tapes, until eventually all that tapes are either at or below the critical state. If the initial flux in the loop is too large, the critical current in the all the tapes will be exceeded, and some of the flux will escape. The field/flux that is required for charging one of the present tapes or tape arrangements via field freezing to its maximum field/flux is similar to the field/flux that the TTFM produces once it is charged.

Figure 13:
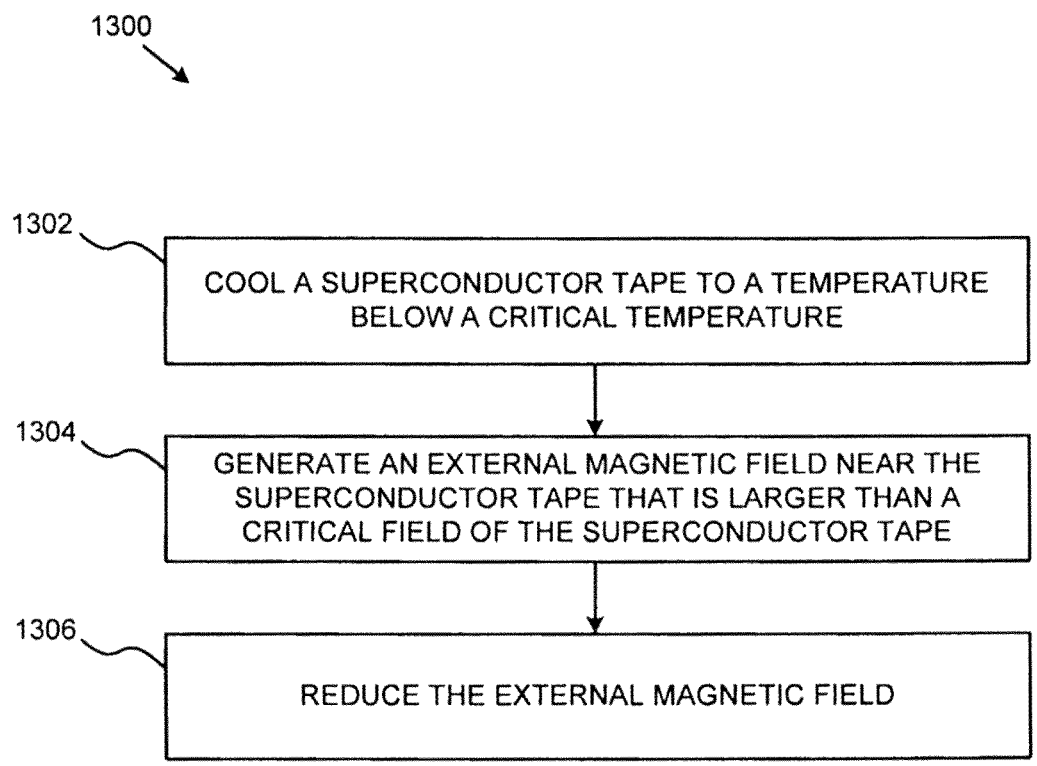

Steps of a second charging method, pulse charging, are shown in FIG. 13. At step 1302 of pulse charging method 1300, the tape or tapes are cooled to a temperature below a critical temperature, rendering it or them superconducting. At step 1304, an external magnetic field is applied, such as by external coils, that generates currents in the TTFM that are larger than critical. The field generated by the external coils needs to be approximately twice the critical field of the tape or tapes in order to charge the tapes to their critical state. During charging, opposing current will appear that will otherwise prevent the penetration of the flux inside the loop. However, once the currents are large enough to drive the superconductor to the flux-flowing state, further increase in flux will push the flux through the superconductor while the superconductor is still carrying approximately the critical current. Once the field outside the loop is about twice critical, the field inside the loop will be critical, but in the direction that reverses the applied external field. When the external field is reduced, at step 1306, the current in the tape/tapes decreases and eventually reverses. The maximum flux/field trapped corresponds to the critical conditions in the tapes. In this case, the field/flux that needs to be applied needs to be approximately twice the field/flux that the TTFM produces once it is charged.

If the external applied field/flux is less than critical, there will be no (or very little) field penetration into the loop. If the external field is more than twice critical, there will be more flux trapped inside the loop than the loop can support, and thus during the period when the external field is being reduced, some of the flux inside the loop will creep out of the loop. Thus, there is an optimal range of charging fields. This is also true when iron is in the circuit. There is a range of external flux below which there is no or little flux in the loop, or a flux beyond which the flux trapped in the loop (once the external field is removed) is constant. Thus, there is an optimal field/flux for charging the loops.

Figure 14:
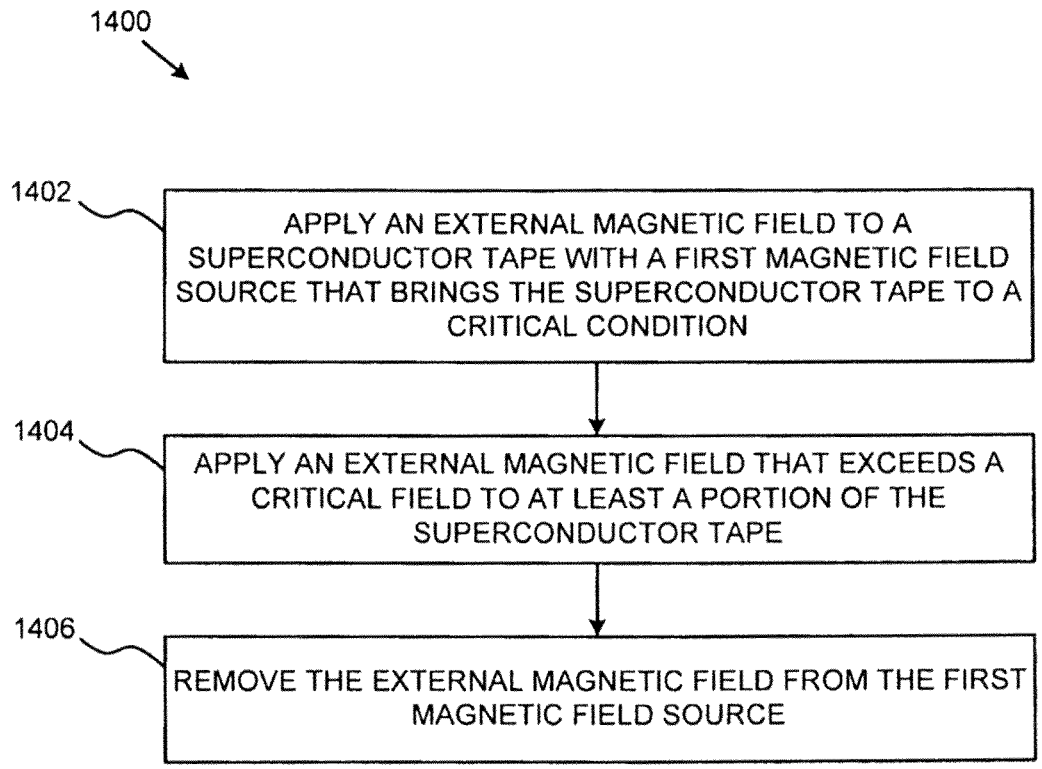

Steps of a third charging method, flux pumping, are shown in FIG. 14. Flux pumping involves inducing currents/fields in the tape or tapes that bring the tape or multi-tape arrangement to critical condition. Once the tapes are cold enough to be superconducting, an external field is applied at step 1402, and superconducting current flows in the superconductor tape/tapes, preventing the penetration of the field. At step 1404, an external magnetic field that exceeds a critical field is applied to at least a portion of the tape/tapes, causing the superconducting current to decay. Eventually, all the field/flux will penetrate. At step 1404, the critical field can be generated by a separate set of coils (flux-penetration coils—here, "coil" will be understood to include a single member that has a multiple connected spirals, or sets of multiple connected spirals) placed very close to the loop. The critical field could be over the entire loop, or it can be over only a portion of the loop, as long as somewhere along the superconductor tape/tapes there is a region at or beyond critical that allows for flux motion into the loop. With flux pumping, the charging field does not have to be approximately twice that of the trapped field, which simplifies the charging circuit. However, flux pumping uses a second set of coils, which could be either superconducting or resistive. The charging can take place with charging coils that are pulsed (and the flux-penetration coils are pulsed or operated with a continuous wave (CW)), or operated with a CW (and the flux penetration coils are either pulsed or operated with a CW). After the flux has penetrated, the externally applied field applied in step 1402 is then removed at step 1406.

Figure 15A:
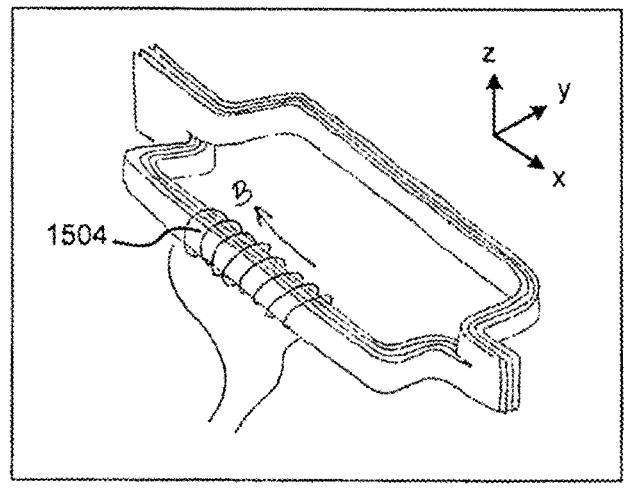
FIGS. 15A-15C show illustrative coils that can be used for flux pumping of the tape superconductors.
Figure 15B:
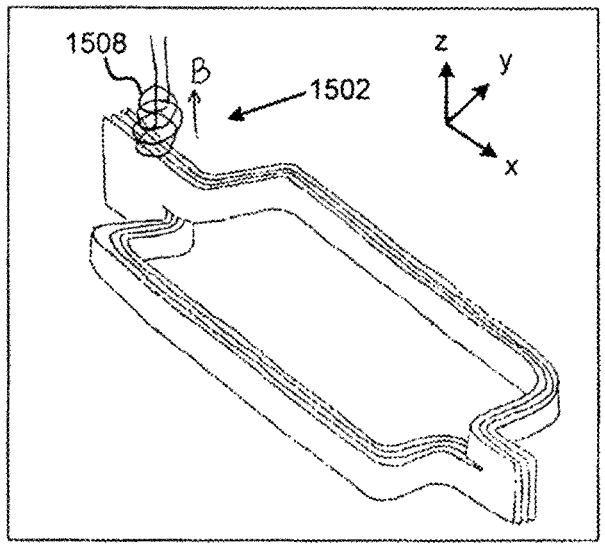
Figure 15C:
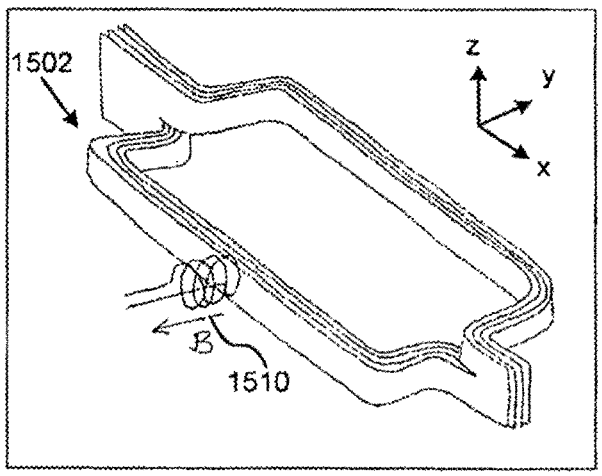

One embodiment for implementing the flux-pumping approach includes placing the flux-pumping coils 1508 near the regions 1502 of the tapes of the subject TTFM, as shown in FIG. 15B. Another embodiment is to locate a solenoidal/toroidal loop 1504 around the tapes, as shown in FIG. 15A. FIG. 15C shows a dipole field 1510 on one of the sets of legs of the TTFM. Multi-pole fields, which have a relatively low associated magnetic energy and are thus relatively easy to generate, can also be used. However, the flux pumping coils may be placed anywhere along the loop and, in some embodiments more than one flux pumping coil may be used.

In either the pulsed charging or the flux-pumping methods, there can be multiple pulses, with the field/flux in the loop increasing with each pulse. Or, charging via these methods may be achieved with a single pulse.

In some embodiments of the present methods, the time constant of the charging pulse has to be long enough to allow induced currents in the coil to decay. For superconductor tapes that are silver-coated, the resistance will be dominated by the silver coating. Thin silver coatings should result in higher resistances and faster decay time of the currents flowing in the silver, which prevent the flux from penetrating during the charging time. A thin silver coating may be used for other reasons, such as providing a smaller thermal conduction when used as current leads or to result in faster quenches, when quick removal of the field is desired (as during faults, as will be described below). In addition, silver alloys in the coating (instead of pure silver) may be used to shorten the decay time of the currents flowing in the silver during pulse charging. The ramp rate of the charging field also determines the heating. Pulses longer than the L/R time are desired. Shorter pulses, with small amplitudes, could be used for multiple pulse charging, with reduced temperature rise (and, thus, higher critical currents) of the superconductor.

During the pulsed charging or flux pumping, there will be dissipation in the superconductor tapes, in either the partially slit tapes or the wound shorted tapes (shown in FIG. 7). The dissipation is due to the flux flow through the superconductor. In order to minimize the temperature rise of the superconductor, the superconductor tapes should have little copper because, otherwise, the currents induced in the superconductor tapes could flow in the copper, preventing flux flow. The heat generation during the flux flow period will increase the temperature of the superconductor. High thermal capacity is desired. Any material with substantial thermal capacity can be used minimizing the temperature increase during the flux flow period. Although the above description discusses the use of high-temperature superconductors, such as second generation coated conductors, the present tapes, tape arrangements, and the resulting magnets may comprise other superconductors. In particular, magnesium diboride either tapes or shorted strands, with operating temperatures as high as 20-30 K, could also be used. The temperature of operation for the magnesium diboride would be lower than that of YBCO-like materials, but still much higher than those of typical low-temperature superconductors, such as niobium titanium or niobium tin. Currently-available magnesium diboride tapes may not be wide enough to be partially slit (as are the tapes shown in, for example, FIG. 2A), so magnets made using magnesium diboride may utilize joints (as shown in FIG. 7). In addition, magnesium diboride tape has superconducting filaments, and slicing the tape would force the current to flow through the normal metal outside of the filaments. Furthermore, even if the filaments in magnesium diboride tape are not transposed and do not rotate along the length of the tape, for the partially slit tapes the current would have to travel across the splice that joins the filaments, and thus be resistive.

Thus, the preferred method for using magnesium diboride would be to wind the coil with multiple turns of a single tape or strand, and then make a superconducting joint between the ends of the tapes or strands, such as is shown in FIG. 7.

The charging time depends on the charging method. When pulsed charging is used (e.g., such as in methods 1300 and 1400), the duration of the charging pulses are typically milliseconds, determined by decay of the skin currents. The flux pumping field for method 1400 may be faster. For method 1200, the charging time is determined by the time required to cool the superconductor, and is typically measured in minutes.

One may adjust the amount of magnetization by manipulating the charging field and/or the charging time. Because of shielding current that prevents currents from flowing in the superconductor, the rate of field application can be used to adjust the trapped field, even with fixed peak applied external fields. In addition, the field can be decreased (and even reversed) by applying reverse field for a given duration (amplitude and duration are variables that can be used in the charging/adjusting process).

The charging coils for providing the flux that is trapped in the TTFMs can be external to a fixture where a TTFM is mounted, or it can be part of the fixture.

In at least some embodiments of the present magnets, it is possible to rapidly decrease the current/field in the magnet by internally "dumping" or quenching the energy, especially in the absence of a copper stabilizer. In order to initiate (trigger) a quench, it is necessary to bring the superconductor to the current sharing condition, where dissipation will rapidly turn the magnetic field energy into heat in the superconductor. Four methods can be used to bring the superconductor to its current sharing condition that would trigger the quench: 1) through raising the temperature of the superconductor, 2) through the application of a magnetic field, 3) through the induction of electrical current, or 4) through combinations of the previous three methods. In certain embodiments, the resistance, when the superconductor is normal, will be dominated by the silver layer (which can be 1 micron thick for some of the tapes) on top of the superconductor. The L/R time constant for the decay can be substantially smaller than a cycle (assuming 60 Hz), thus making it possible to use an internal dump for protection of a motor, for example, during faults. While such an approach is also possible with TFM monoliths, substantially more energy would be required to heat or magnetize the entire array of monoliths to initiate a quench over the entire array. In the case of a TTFM, in order to start a quench (internal dump), the loop needs to be warmed or magnetized to the current sharing temperature only over a small region; the mass of the material that needs to be warmed up or magnetized to initiate a TTFM quench is less than what would be involved in creating a comparably-rapid quench in a TFM array. The rapid internal dump in the TTFM's can be used when there are a large number of unconnected loops, as well as when the coil is made from several turns of a conductor, in which case the current flows in series, with very different inductance and resistance from when the multiple loops are in parallel.

There are many ways of heating loops for triggering an internal dump. For example, heating could be achieved using electrical heaters. In such cases, the thermal time constant of the tapes needs to be small compared with the desired energy dump time.

Another way to heat the loops is to use RF fields. In this case, the heat may be deposited directly on the tapes. Although any tapes would be adequate (using hysteresis losses in the superconductor or AC losses in the electrical conductors), magnetic tapes with a magnetic substrate could be heated more easily (magnetic hysteresis in the substrate) than tapes that are heated exclusively by hysteresis in the superconductor and eddy currents in the copper. For applications where the temperature of the superconductor is raised (either by electric heated, magnetic or superconducting hysteresis or eddy currents) in order to generate an internal dump, minimal heat capacity of the superconducting loops would be desirable. Flux-pumping coils, such as those described above, could be used for generating the internal dump, though other set of coils could also be used.

A quench may be induced by applying magnetic fields to a section or all the superconductor, or by raising the temperature of a section or all the superconductor, bringing it to the normal state. For example, the flux-pumping coils could be used to bring the superconductor to the normal state, without raising the temperature. The coils would heat up because of the internal dump, but by not heating the superconductor prior to the quench. In this manner it is possible to minimize the thermal excursion of the superconductor and therefore decrease the time required for recovery. There can be material in thermal contact with the superconductor to cool the superconductor, as shown in FIG. 9. An appropriate thermal time constant would be needed in order to not increase the power required for heating the superconductor, but to cool it with longer time constants.

Recovery after an internal quench would require recooling the superconductor and re-charging the TTFM. For applications where the TTFMs are in a magnetic circuit with magnetic material (for example, iron), recooling is not very time consuming, as the energy that needs to be removed is not very large. The recharging the TTFM may determine the duration of the time when the magnet or motor or generator (depending on the application) is out of service. In embodiments in which the charging coil is permanently placed in the assembly next to the loops (for example, in the rotor next to the TTFM's in a motor, or in the same cartridge as the loops), recharging could be very fast and the down time may be determined by recooling of the superconductor. The recooling of the superconductor could take seconds if there is enough thermal mass to remove the heat from the superconductor. The charging time could be as short as tens of milliseconds, depending on the nature of the charging method.

Embodiments of the present tape arrangements may be placed in a cartridge that provides support and cryogenic functionality. The cartridge can be introduced into motor or another part of a magnetic circuit prior to the tape arrangement being charged. The cartridge (together with any magnetic element outside the cartridge) can be removed as a unit and reintroduced after maintenance, or replaced by a different cartridge, because they need not be charged at the time of removal or installation.

A cartridge that is configured for use in a magnetic circuit such as a motor or an electromotor should have one or more magnetic elements inside it or coupled to it in order to minimize the height of the gap in the magnetic circuit (so as to result in a gap with a low value of permeability). Minimizing the gaps along a magnetic circuit minimizes the amount of superconductor required for a given magnetic field somewhere in the magnetic circuit (such as the gap between the rotor and the stator, or the gap between magnet poles in an electromagnet). One way to accomplish the minimization of the gaps in the magnetic circuit is to place one or more magnetic elements in the region inside of the tape arrangement (which may be one or more of the self-shorted loops shown in FIG. 7 or a partially slit tape stack) in the cartridge. For some embodiments, such as those involving an alternating current (AC) application, the one or more magnetic elements placed inside the loop can be laminated, to minimize the losses, or to allow the charging of the tape stack.

Figure 16:
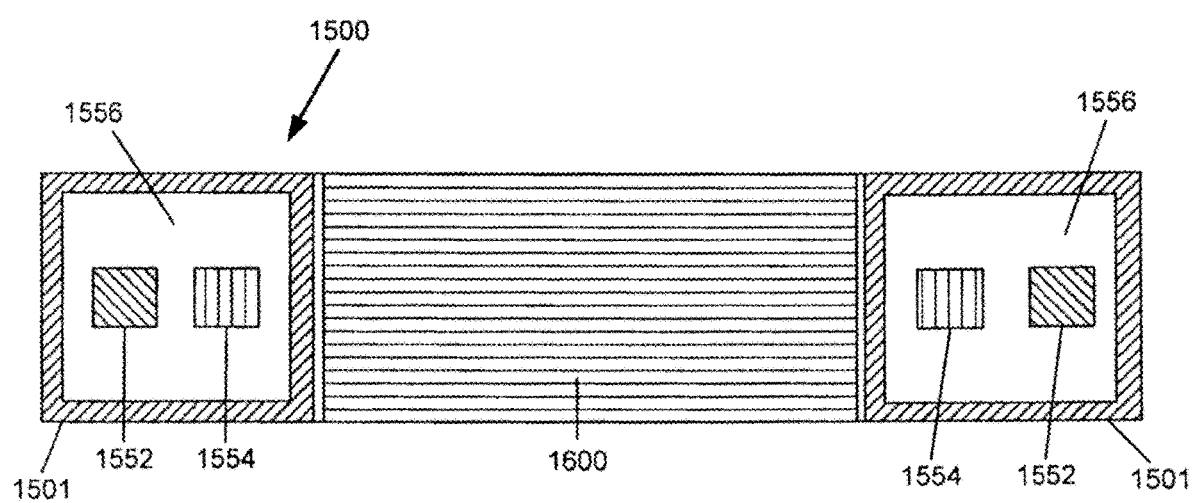
FIG. 16 shows a cross section of a cartridge with a racetrack-like cryostat that encloses at least one tape arrangement, such as a superconducting tape stack having partially-slit tapes, and at least one charging coil. Warm iron is also shown.

FIG. 16 shows a cross-sectional view of cartridge 1500, one embodiment of the present cartridges, together with a magnet element. Cartridge 1500 includes cryostat 1501, which has a ring configuration and may have an outer configuration that is, for example, rectangular or any other suitable configuration, such as a racetrack configuration that corresponds to the shape of the enclosed tape arrangement. The opening in the middle of cryostat 1501 is substantially occupied by magnetic element 1600, which is preferably iron (such as laminated iron), and more preferably in the depicted embodiment, "warm" iron (meaning iron that is not in the cryostat). Cartridge 1500 also includes charging coil 1502 inside of cryostat 1501 and tape arrangement 1504, which is also inside of cryostat 1501 and which can be any of the present tape arrangements, such as tape 202, tape stack 300, tape stack 400, etc. An example of a suitable charging coil for use as charging coil 1552 is a charging coil made from wound HTS tape or it could be a resistive coil comprising copper, and having current leads in either case. Cryostat 1501 may be made from a material or materials, such as non-magnetic stainless steel. Embodiments of the present cartridges that can be charged using a slowly varying charging field, for example, with time constants that are comparable or longer than the thermal time constant of the tape arrangement 1544, so that field freezing can be used for energization (the field is maintained while the tape arrangement is cooled to its superconducting temperature). Cartridge 1500 will be configured so that current leads (not shown) for charging coil 1552 can be connected to and transfer current to charging coil 1552 from a current source, such as a direct current (DC) power source. Although the charging coil shown in FIG. 16 is inside the cryogenic environment, in other embodiments it may be placed outside the cryostat, and the charging coil would then be normal resistive. Also, in some embodiments where the charging coil is not placed in the cartridge, the charging coil may be mounted, for example, outside the cartridge in the rotor.

Cartridge 1500 also includes coolant 1556 inside of cryostat 1501 and surrounding charging coil 1552 and tape arrangement 1554. An example of a coolant suitable for use as coolant 1556 is liquid nitrogen or helium (liquid or gaseous). Coolant 1556 will be used to reduce the temperature of the cartridge prior to charging the cartridge (and, more specifically, tape arrangement 1554), and to maintain the temperature of the cartridge and its components after charging to support superconductor operation. Thus, because the outer surface of cartridge 1500 will be warm during use, cryostat 1501 may be provided with one or more radiation shields and/or include a volume occupied by a vacuum to further serve the functions of thermal insulation.

Cryostat 1501 may include fittings for introducing and withdrawing coolant 1556, one or more vacuum ports (when the cartridge is configured with a volume that can be evacuated to create an insulating vacuum), and/or current leads, which can be used for energizing charging coil 1552. Because, in at least some embodiments, charging coil 1552 will be energized only during the charging process, the current leads can be disconnected from the charging coil after charging by providing a break (not shown) in cryostat 1501, which should eliminate the heat due to conduction through the current leads. For re-charging, the connection would be established again. Motion between conducting elements of the current leads inside cryostat 1501 can be used to make or break the electrical connection, as will be understood by those of ordinary skill in the art.

Cartridge 1500 may, in some embodiments, include a pocket for magnetic element 1600. In embodiments of the present cartridges 1500 that are used with a magnetic element comprising warm iron, the cartridge and the warm iron can be filled with a material to make the combined cartridge and warm iron into a monolith. The filler material can, for example, be an organic material, such as many types of epoxies, that can also be made into a composite with a reinforcement, such as fiber-reinforced epoxy. The fibers can be glass, carbon, or other types of reinforcement. Suitable epoxies are not limited to those suitable for cryogenic operation because the filler material will be warm.

In at least some embodiments, mechanical loads will be transmitted between the cold region that includes charging coil 1552 and tape arrangement 1554 and the warm region of the cryostat. These mechanical loads are transferred through one or more distributed elements (such as thin plates or spacers, which may be metallic (such as stainless steel) or nonmetallic (such as G10)) to minimize the cross section of the mechanical load support and thus minimize the thermal conduction along the elements supporting the cryostat.

Charging of tape arrangement 1554 specifically (and of cartridge 1500 more generally) should be performed when the cartridge is not in use, such as when the motor in which it is positioned (or will be positioned) is not rotating, or when the electromagnet of which it is a part (or will be a part) is not operational. Once charged, the current leads can be disconnected from cartridge 1500 and the current leads inside cryostat 1501 can also be disconnected, as described above.

It is possible to make charging coil 1552 also superconducting, either in cryostat 1501, or in a separate cryostat. In embodiments in which charging coil 1552 will be superconducting, the charging coil may comprise one or multiple turns of a tape that has approximately the same shape as tape arrangement 1554 (located either inside or outside (e.g., on top or below) of tape arrangement 1554), and may have a cross section that is similar to that of tape arrangement 1554. If this is done in cryostat 1501, it may be possible to charge tape arrangement 1554 by action of the charging coil 1552 by any of the techniques discussed above, such as field freezing or pulse charging. If field freezing is used, and the same superconducting material is used for both tape arrangement 1554 and charging coil 1552, the temperature difference during an initial stage or stages of charging between the two superconductors should be maintained such that the superconducting charging coil 1552 has a lower temperature than tape arrangement 1554, and the temperature of tape arrangement 1554 should be sufficiently increased so that the tape arrangement becomes normal during the energization of charging coil 1552. The temperature of tape arrangement 1554 is then reduced to make it superconducting, after which charging coil 1552 is de-energized.

In some embodiments of the present methods, all of the cartridges of a given magnetic system (such as a motor, generator, or electromagnet) may be charged simultaneously using field freezing, thus reducing or preventing the generation of loads that are asymmetrical and not present when all the different cartridges are otherwise charged.

In embodiments of the present methods in which pulsed charging is used to charge one of the present cartridges (and, more specifically, the tape arrangement in the cartridge), the pulsed charging coil (e.g., charging coil 1552) can comprise a material with a relatively high electrical conductivity. For example, such a charging coil can be made from copper with low electrical resistivity, such as high-purity, oxygen-free copper. The charging coil may be adiabatic during the field freezing process, and then re-cooled by the coolant (if inside the cryostat) after the charging process is complete.

Figure 17:
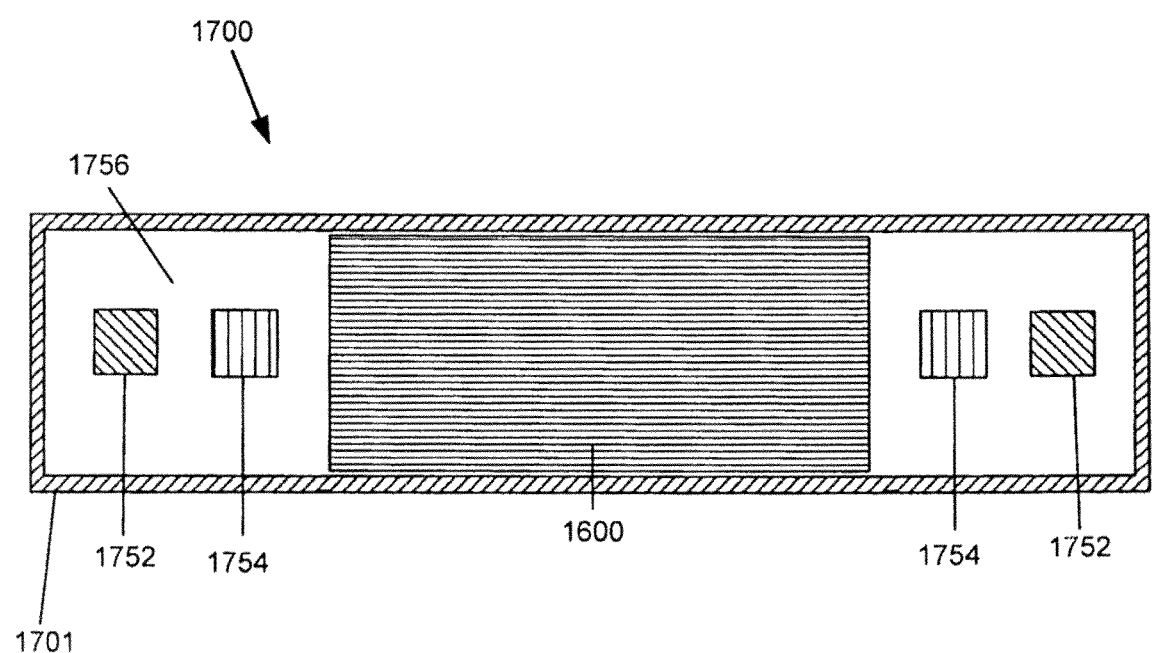
FIG. 17. shows a cross section of a cartridge having a cryostat enclosing cold iron, at least one tape arrangement, such as a superconducting tape stack having partially-slit tapes, and at least one charging coil.

FIG. 17 shows a cross-sectional view of cartridge 1700, one embodiment of the present cartridges, together with a magnet element. Cartridge 1700 shares similarities with cartridge 1500, and, thus, uses similar element numbers (e.g., 1701 represents the cryostat of cartridge 1700, just as 1501 represents the cryostat of cartridge 1500). One difference is in the shape of cryostat 1701, which, does not include an opening for magnetic element 1600 but instead encloses magnetic element 1600, which can be iron that is "cool," meaning in this embodiment magnetic element 1600 is within cryostat 1701 and therefore subject to contact with coolant 1756. Another difference is that a gap exists between magnetic element 1600 and the inner surface of cryostat 1701. Cartridge 1700 also includes charging coil 1752 inside of cryostat 1701 and tape arrangement 1754, which is also inside of cryostat 1701 and which can be any of the present tape arrangements, such as tape 202, tape stack 300, tape stack 400, etc. Cartridge 1700 may be used in any embodiment in which cartridge 1500 may be used, and the description of the structure, materials for, and operation of cartridge 1500 applies generally—as those of ordinary skill in the art having the benefit of this disclosure will understand—to cartridge 1700 as well.

Figure 19:
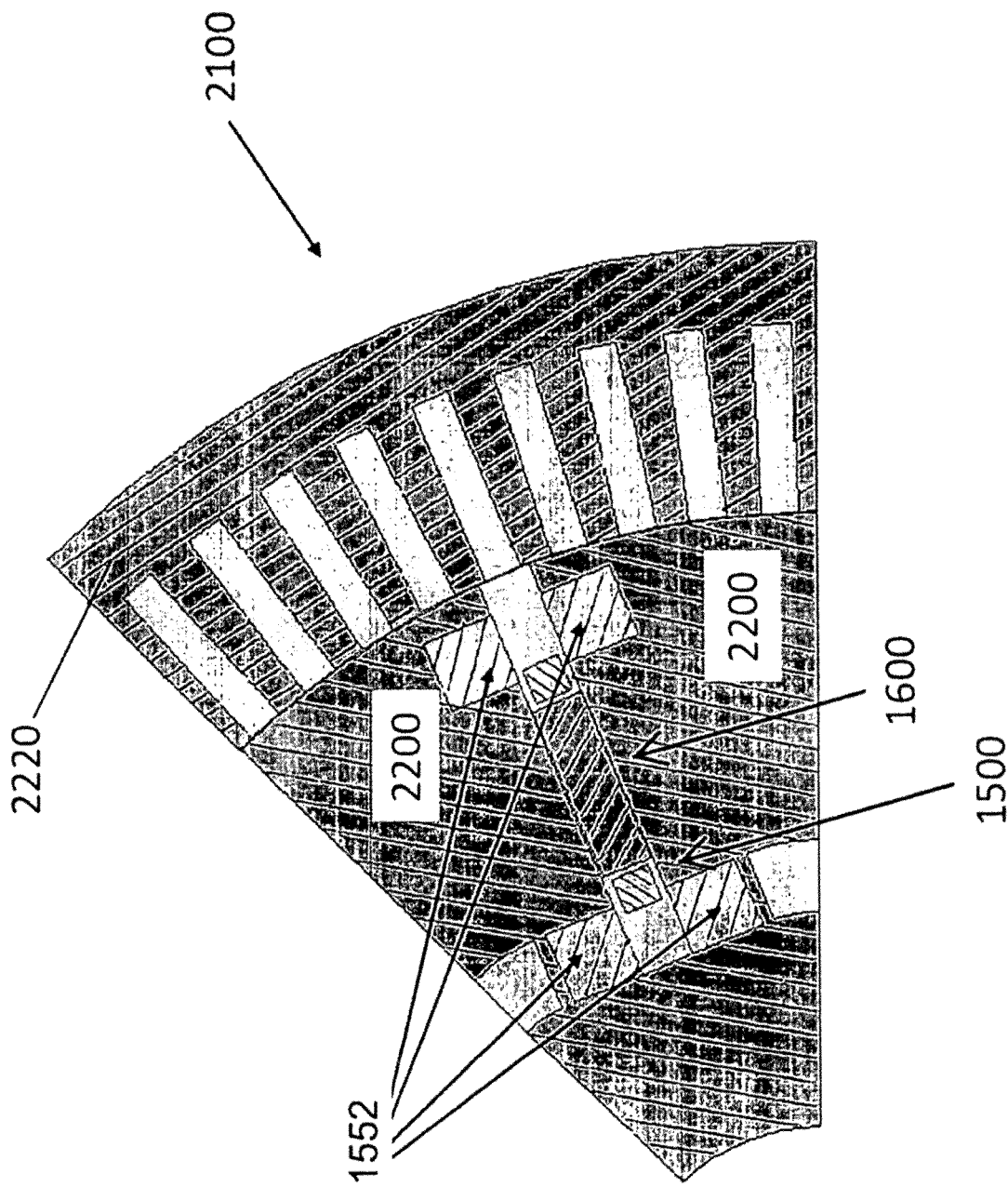
FIG. 19 shows a cross section of a portion of the rotor and the stator of a rotating electric machine, such as a motor or generator, with a cartridge, iron, and charging coil.

FIG. 19 shows a section of a portion of rotating electric machine 2100 in which one of the present "warm" iron cartridges 1500 (which is shown schematically and in a section view) is positioned. The cartridge is positioned such that the loop, or tape arrangement, is oriented such that the longest legs of the loop/tape arrangement are oriented axially with respect to machine 2100. Portions 2200 of the rotor, which are adjacent cartridge 1500, may be characterized as the yoke of the rotor. Also shown is the stator 2220. The charging coils 1552 in this illustrative example are outside of the cartridge and are the embedded in the yoke of the rotor. The cartridge 1500 is shown next to warm iron 1600, and they can be held together by, for example, impregnation.

Figure 20:
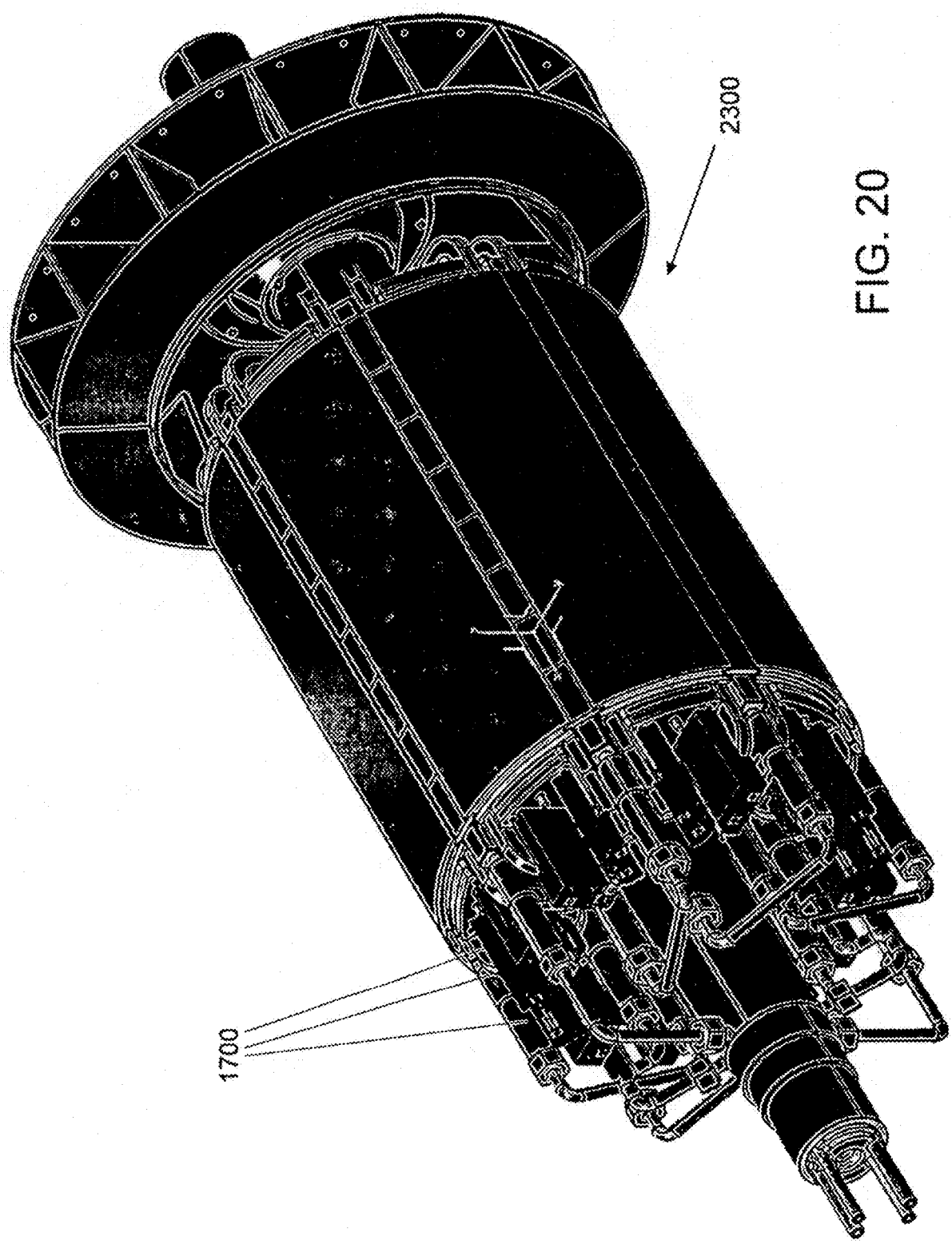
FIG. 20 shows a portion (the rotor) of a rotating electric machine with cartridges.

FIG. 20 shows a perspective view of rotating electric machine 2300 in which multiple cartridges 1700 have been positioned in the rotor. As the figure shows, cartridges 1700 have lengths that are greater than their widths, and each cartridge is positioned such that the length thereof is positioned axially with respect to machine 2300, and the width thereof is positioned radially with respect to machine 2300.

Figure 21:
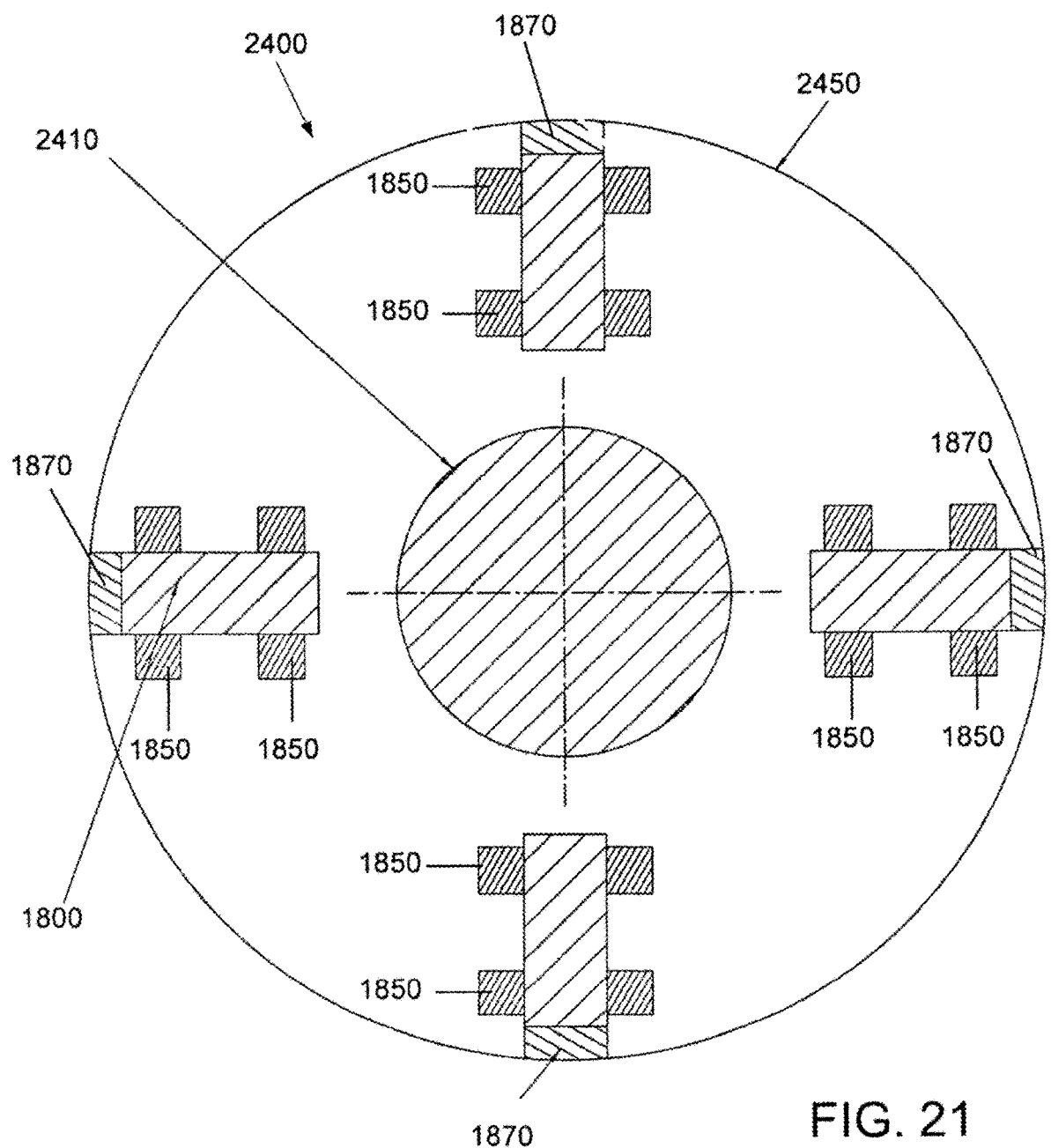
FIG. 21 shows a cross section of a rotor of another rotating electric machine with cartridges.
Figure 22:
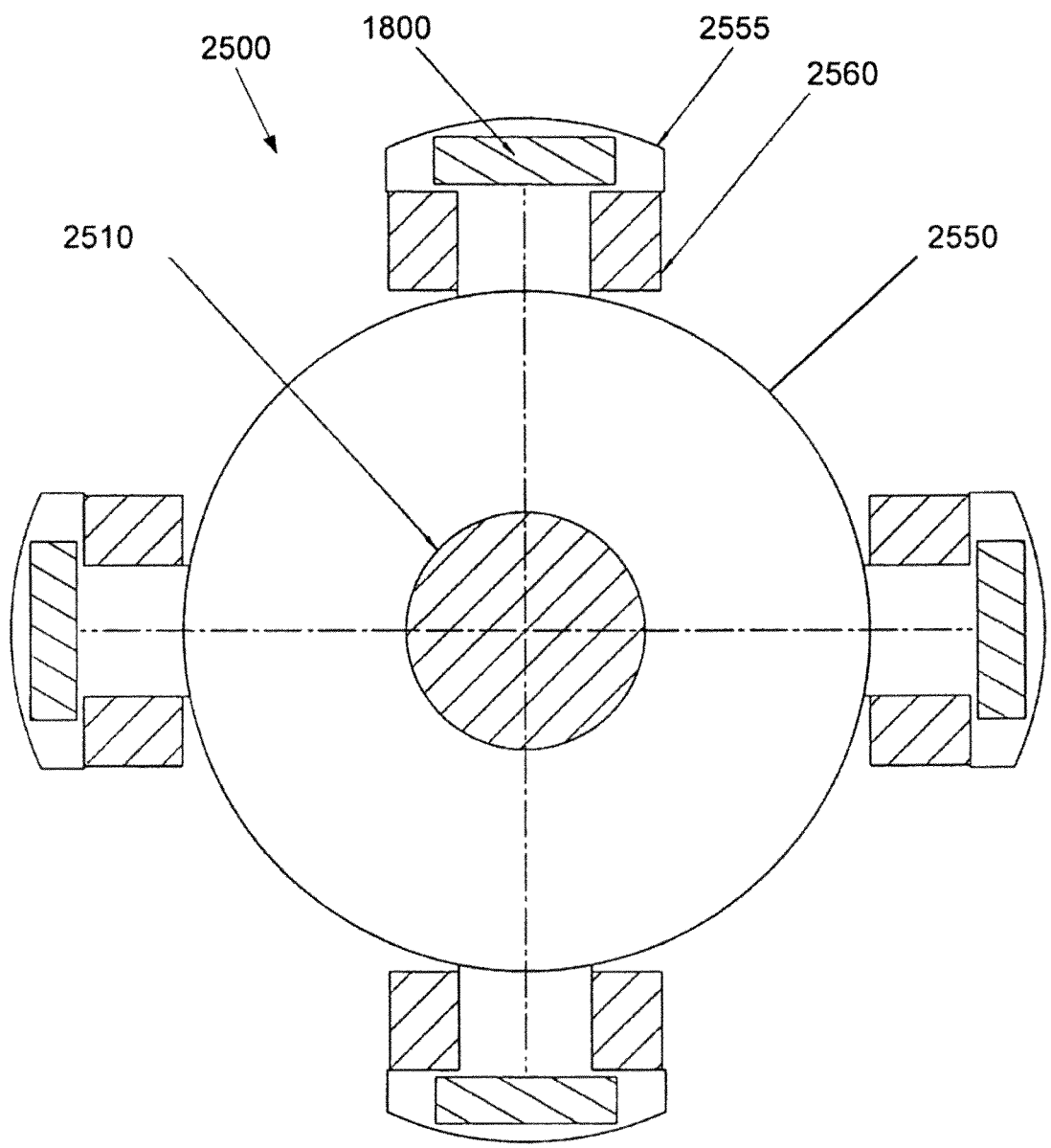
FIG. 22 shows a cross section of a rotor of another rotating electric machine with cartridges.

Examples of other cartridge-in-machine arrangements are shown in FIGS. 21 and 22. In FIG. 21, rotating electric machine 2400 includes a shaft 2410 coupled to laminated rotor 2450; the axis of the machine is illustrated by the crossed, dashed lines. In this embodiment, the rotor laminations have open regions into which cartridges 1800, which are some embodiments of the present cartridges that do not include a charging coil inside the cartridge. Instead, two charging coils 1850 are positioned outside of and around cartridges 1800. Retainers 1870 are also coupled to rotor 2450 in order to keep cartridges 1800 in position during operation of machine 2400. In FIG. 22, rotating electric machine 2500 includes a shaft 2510 coupled to rotor 2550 having rotor poles 2555. Each rotor pole, and more specifically each rotor pole tip, has an open region into which one of cartridges 1800 is positioned. The rotor winding 2560 associated with a given rotor pole may be used as a charging coil (which, in any of the present embodiments, may be characterized as an activation coil) to charge the cartridge, and, more specifically, the tape arrangement in the cartridge. The axis of machine 2500 is illustrated by the crossed, dashed lines.

All of the methods disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. For example, most of the embodiments above were describes as being used with high-temperature superconductors. However, the embodiments may also be used with other superconductor material. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

What is claimed is:

1. A magnet comprising:
    multiple stacks that each comprises multiple superconductor tapes, each superconducting tape in each stack having two ends; and
    a slit in each superconductor tape between its two respective ends that forms two respective legs in each tape, the two respective legs in each tape being separated from each other;
    the stacks being arranged so that the tapes form a loop;
    where the two ends of each of the tapes in one stack are located outside the loop and the two ends of each of the tapes in another stack are located inside the loop.

2. The magnet of claim 1, where one leg of one of the tapes intersects a first plane but not a second, parallel plane that is intersected by the other leg of that respective tape.

3. A magnet comprising:
    multiple stacks that each comprises multiple superconductor tapes, each superconducting tape in each stack having two ends; and a slit in each superconductor tape between its two respective ends that forms two respective legs in each tape, the two respective legs in each tape being separated from each other;

the stacks being arranged so that the tapes form a loop;

where one leg of one of the tapes intersects a first plane but not a second, parallel plane that is intersected by the other leg of that respective tape, and the tapes on one stack are longer than the tapes in another stack.

4. A tape arrangement comprising:

a superconductor tape having two ends that is wound in a coil, the superconducting tape having a superconducting side and an opposing non-superconducting side and a length, the superconducting tape being arranged such that the superconducting side of the tape is adjacent to and coupled to itself for greater than half of the length.

5. A method or trapping a magnetic field in a superconductor tape, the met comprising:

establishing an external magnetic field near a superconductor tape when the superconductor tape is at a temperature above a critical temperature, where the superconductor tape has two ends, a slit in the superconductor tape between the two ends that forms two legs, and a separation between the legs that forms a loop;

cooling the superconductor tape to a temperature that is below the critical temperature; and removing the external magnetic field.

6. A magnet comprising:

a superconductor tape having two ends, a slit in the superconductor tape between the two ends that forms two legs, and a separation between the legs that forms a loop having an axis;

the superconductor tape positioned around a cylinder having a cylinder axis such that the axis of the loop is not parallel to the axis of the cylinder.

* * * * *

UNITED STATES PATENT AND TRADEMARK OFFICE
CERTIFICATE OF CORRECTION

| | | |
|---|---|---|
| PATENT NO. | : 11,937,519 B1 | |
| APPLICATION NO. | : 13/815975 | |
| DATED | : March 19, 2024 | |
| INVENTOR(S) | : Leslie Bromberg et al. | |

It is certified that error appears in the above-identified patent and that said Letters Patent is hereby corrected as shown below:

In the Claims

In Claim 5, Column 21, Line 17, "or" is replaced with --for--.

In Claim 5, Column 21, Line 18, "met" is replaced with --method--.

Signed and Sealed this
Tenth Day of December, 2024

Katherine Kelly Vidal
*Director of the United States Patent and Trademark Office*